(12) United States Patent
Lee

(10) Patent No.: US 12,156,430 B2
(45) Date of Patent: Nov. 26, 2024

(54) DISPLAY DEVICE

(71) Applicant: Samsung Display Co., LTD., Yongin-si (KR)

(72) Inventor: Dae-Won Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/205,205

(22) Filed: Jun. 2, 2023

(65) Prior Publication Data

US 2024/0138187 A1 Apr. 25, 2024
US 2024/0237402 A9 Jul. 11, 2024

(30) Foreign Application Priority Data

Oct. 19, 2022 (KR) .................. 10-2022-0135274

(51) Int. Cl.
*G09G 5/00* (2006.01)
*G09G 3/00* (2006.01)
*G09G 3/3225* (2016.01)
*H10K 59/121* (2023.01)
*H10K 59/131* (2023.01)

(52) U.S. Cl.
CPC ......... *H10K 59/1213* (2023.02); *G09G 3/006* (2013.01); *G09G 3/3225* (2013.01); *H10K 59/131* (2023.02); *G09G 2310/0286* (2013.01); *G09G 2330/12* (2013.01)

(58) Field of Classification Search
CPC .. H10K 59/1213; H10K 59/131; G09G 3/006; G09G 3/3225; G09G 2310/0286; G09G 2330/12

USPC .......................................... 345/214
See application file for complete search history.

(56) References Cited

U.S. PATENT DOCUMENTS

| | | | |
|---|---|---|---|
| 2017/0294497 A1* | 10/2017 | Lius ................. | H01L 27/1225 |
| 2018/0108720 A1* | 4/2018 | Kim .................. | H01L 27/124 |
| 2020/0027939 A1* | 1/2020 | Cho .................. | H10K 59/126 |
| 2020/0135825 A1* | 4/2020 | Cha .................. | G09G 3/3266 |
| 2021/0118363 A1* | 4/2021 | Zhang ............... | G09G 3/3233 |
| 2021/0242297 A1* | 8/2021 | Yuan ................. | H10K 59/131 |
| 2022/0139968 A1* | 5/2022 | Li .................... | H01L 27/1251 |
| | | | 257/43 |

FOREIGN PATENT DOCUMENTS

KR  102271585 B1  7/2021

* cited by examiner

*Primary Examiner* — Jennifer T Nguyen
(74) *Attorney, Agent, or Firm* — CANTOR COLBURN LLP

(57) ABSTRACT

A display device includes: a substrate including a display area and a peripheral area adjacent to the display area, pixels disposed in the display area on the substrate, each of the pixels including a pixel transistor and an emission element connected to the pixel transistor, and a driver disposed in the peripheral area on the substrate and including a driver transistor. The driver transistor includes an active pattern, a first gate pattern disposed on the active pattern and overlapping a first channel region of the active pattern, a second gate pattern disposed in a same layer as the first gate pattern and overlapping a second channel region of the active pattern, a first electrode pattern disposed on the active pattern and connected to a source region of the active pattern, and a second electrode pattern disposed on the active pattern and connected to a drain region of the active pattern.

20 Claims, 18 Drawing Sheets

DISPLAY DEVICE

This application claims priority to Korean Patent Application No. 10-2022-0135274, filed on Oct. 19, 2022, and all the benefits accruing therefrom under 35 U.S.C. § 119, the content of which in its entirety is herein incorporated by reference.

BACKGROUND

1. Field

Embodiments provide generally to display device. More particularly, embodiments relate to a display device that provides visual information.

2. Description of the Related Art

With a development of information technology, an importance of a display device, which is a connection medium between a user and information, is being highlighted. A use of display devices such as liquid crystal display device, organic light-emitting display device, plasma display device, or the like, for example, is increasing.

The display device may include a plurality of pixels disposed in a display area and a driver disposed in a peripheral area adjacent to the display area. Signal lines that transmit various signals to the plurality of pixels may be connected to the driver.

SUMMARY

However, not only signals but also unintended electro-static discharge ("ESD") may flow into the signal line. When electro-static discharge flows into the plurality of pixels through the signal line, driving defect of the display device may occur.

Embodiments provide a display device with improved defect.

A display device in an embodiment of the disclosure includes a substrate including a display area and a peripheral area adjacent to the display area, a plurality of pixels disposed in the display area on the substrate, each of the plurality of pixels including a pixel transistor and an emission element connected to the pixel transistor, and a driver disposed in the peripheral area on the substrate and including a driver transistor. The driver transistor may include an active pattern, a first gate pattern disposed on the active pattern and overlapping a first channel region of the active pattern, a second gate pattern disposed in a same layer as the first gate pattern and overlapping a second channel region of the active pattern, a first electrode pattern disposed on the active pattern and connected to a source region of the active pattern, and a second electrode pattern disposed on the active pattern and connected to a drain region of the active pattern.

In an embodiment, the driver may include a scan driver that applies a scan signal to the plurality of pixels.

In an embodiment, the first electrode pattern may include a portion of a first line that applies a scan start signal to the scan driver.

In an embodiment, the driver may include an emission driver that applies an emission control signal to the plurality of pixels.

In an embodiment, the first electrode pattern may include a portion of a second line that applies an emission start signal to the emission driver.

In an embodiment, the active pattern may have a "ㄴ" shape in a plan view.

In an embodiment, the display device may further include a third gate electrode disposed in the display area on a second gate electrode. The pixel transistor may include an active layer, a first gate electrode disposed on the active layer, the second gate electrode disposed on the first gate electrode, a source electrode connected to a source region of the active layer, and a drain electrode in a same layer as the source electrode and connected to a drain region of the active layer.

In an embodiment, the first electrode pattern and the second electrode pattern of the driver transistor may be disposed in a same layer as the third gate electrode of the pixel transistor.

In an embodiment, the first electrode pattern and the second electrode pattern of the driver transistor may be disposed in a same layer as the second gate electrode of the pixel transistor.

In an embodiment, the display device may further include a lighting circuit portion disposed in the peripheral area on the substrate and including a lighting circuit portion transistor. The lighting circuit portion transistor may have a same structure as the driver transistor.

In an embodiment, a source electrode of the lighting circuit portion transistor may include a portion of an inspection signal line that applies a lighting inspection signal to the lighting circuit portion.

In an embodiment, the active pattern may include a silicon semiconductor or a metal oxide semiconductor.

A display device in embodiments of the disclosure may include a substrate including a display area and a peripheral area adjacent to the display area, a plurality of pixels disposed in the display area on the substrate, each of the plurality of pixels including a pixel transistor and an emission element connected to the pixel transistor, and a driver disposed in the peripheral area on the substrate and including a driver transistor. The driver transistor may include an active pattern, a first gate pattern disposed on the active pattern and overlapping a first channel region of the active pattern, a second gate pattern disposed in a same layer as the first gate pattern and overlapping a second channel region of the active pattern, a third gate pattern disposed in a same layer as the first gate pattern and overlapping a third channel region of the active pattern, a first electrode pattern disposed on the active pattern and connected to a first region of the active pattern, and a second electrode pattern disposed on the active pattern and connected to a second region of the active pattern.

In an embodiment, the active pattern may have an "E" shape in a plan view.

In an embodiment, the first region may be a source region, the second region may be a drain region, and the second electrode pattern may include a first portion and a second portion branched off from the first portion, the second portion connected to the second region in a plan view.

In an embodiment, the first region may be a drain region, the second region may be a source region, and the second electrode pattern may include a first portion and a second portion branched off from the first portion, the second portion connected to the second region in a plan view.

In an embodiment, the active pattern may have a "ㄹ" shape in a plan view.

In an embodiment, the driver may include a scan driver that applies a scan signal to the plurality of pixels, and the first electrode pattern may include a portion of a first line that applies a scan start signal to the scan driver.

In an embodiment, the driver may include an emission driver that applies an emission control signal to the plurality of pixels, and the first electrode pattern may include a portion of a second line that applies an emission start signal to the emission driver.

In an embodiment, the display device may further include a lighting circuit portion disposed in the peripheral area on the substrate and including a lighting circuit portion transistor. The lighting circuit portion transistor may have a same structure as the driver transistor. A source electrode of the lighting circuit portion transistor may include a portion of an inspection signal line that applies a lighting inspection signal to the lighting circuit portion.

In an embodiment of a display device according to the disclosure, at least one of a driver transistor of a driver directly connected to a line that applies a start signal and a lighting circuit portion transistor of a lighting circuit portion directly connected to a line that applies a lighting inspection signal may have a dual transistor structure in which two transistors are connected in series with each other, a triple transistor structure in which three transistors are connected in series with each other, or a multi-transistor structure in which four or more transistors are connected in series with each other. Accordingly, defect of the display device due to inflow of electro-static discharge may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
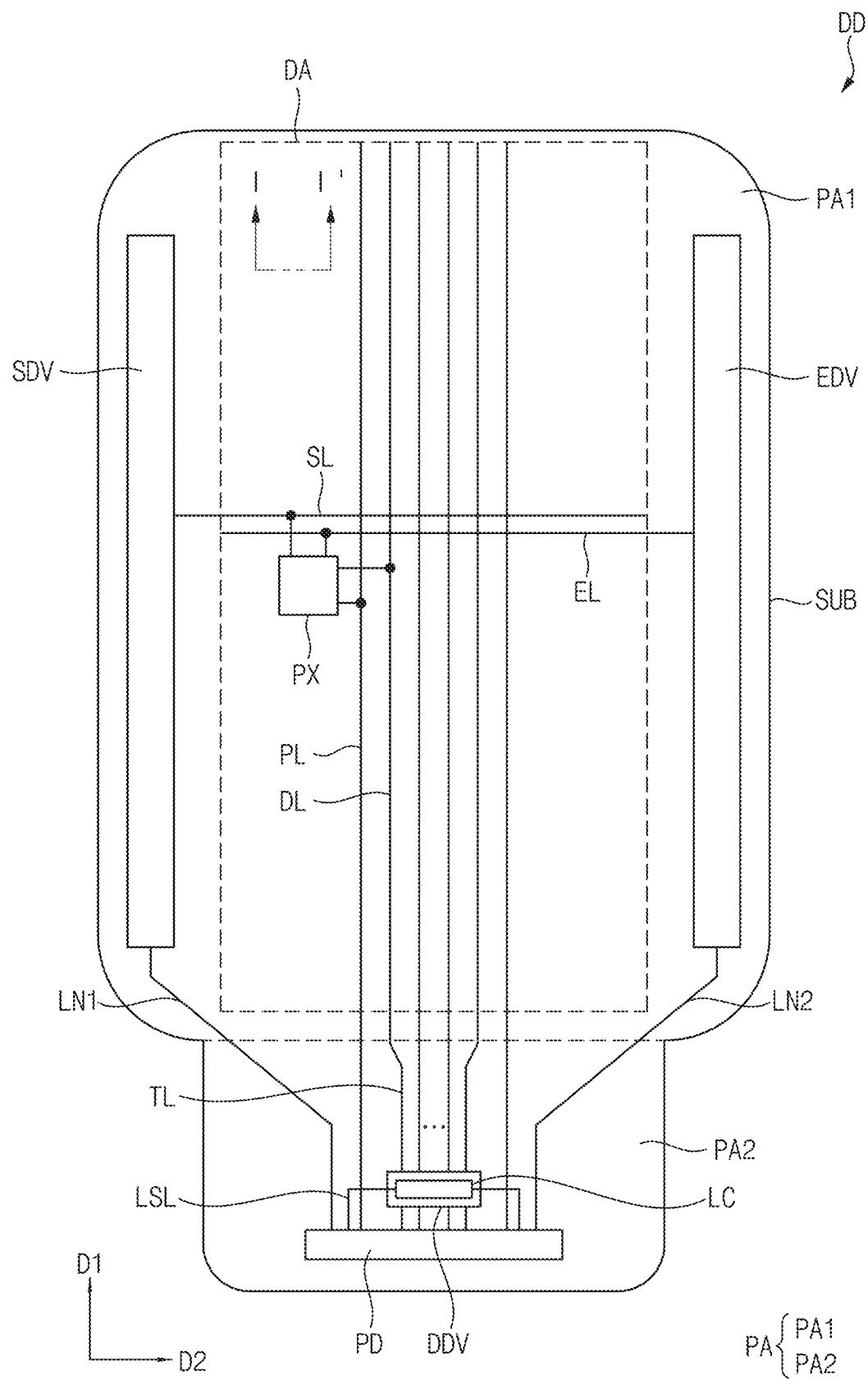
FIG. 1 is a plan view illustrating an embodiment of a display device according to the disclosure.

Hereinafter, a display device in embodiments of the disclosure will be explained in detail with reference to the accompanying drawings. The same reference numerals are used for the same components in the drawings, and redundant descriptions of the same components will be omitted.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating an embodiment of a display device according to the disclosure.

Referring to FIG. 1, a display device DD in an embodiment of the disclosure may include a substrate SUB, a plurality of pixels PX, a driver, a pad portion PD, and a lighting circuit portion LC.

The substrate SUB may include a display area DA and a peripheral area PA. The peripheral area PA may include a first peripheral area PA1 and a second peripheral area PA2. The first peripheral area PA1 may surround at least a portion of the display area DA. The second peripheral area PA2 may be disposed adjacent to a lower end of the display area DA. A portion of the second peripheral area PA2 may be bent based on a virtual bending axis.

The plurality of pixels PX may be disposed in the display area DA on the substrate SUB, and the driver for driving the plurality of pixels PX may be disposed in the first and second peripheral areas PA1 and PA2 on the substrate SUB. In addition, the pad portion PD and the lighting circuit portion LC may be disposed in the second peripheral area PA2 on the substrate SUB.

Each of the plurality of pixels PX may be arranged in a matrix form along a row direction (e.g., a second direction D2) and a column direction (e.g., a first direction D1). In an embodiment, each of the plurality of pixels PX may include a pixel transistor (e.g., a pixel transistor TR of FIG. 7) and an emission element electrically connected to the pixel transistor (e.g., an emission element LED of FIG. 7), for example.

The driver may include a scan driver SDV, a light-emitting driver (also referred to as a light driver or an emission driver) EDV, and a data driver DDV. In an embodiment, the scan driver SDV and the emission driver EDV may be disposed in the first peripheral area PA1, and the data driver DDV may be disposed in the second peripheral area PA2, for example. The scan driver SDV may generate a scan signal by receiving a scan start signal (e.g., a scan start signal FLM of FIGS. 2 and 3) from the pad portion PD. The data driver DDV may generate a data voltage. The light driver EDV may generate an emission control signal by receiving an emission start signal (e.g., an emission start signal ACL_FLM of FIGS. 4 and 5) from the pad portion PD. A detailed description of the scan driver SDV and the emission driver EDV will be described later.

The pad portion PD may be electrically connected to an external device and provide various signals, voltages, or the like to each of the scan driver SDV, the emission driver EDV, and data driver DDV.

The lighting circuit portion LC may inspect the display device DD for defect. The lighting circuit portion LC may include at least one transistor. The lighting circuit portion LC may be disposed under or on the display area DA in a plan view. In an embodiment, the lighting circuit portion LC may be disposed in the second peripheral area PA2, for example. In an embodiment, the lighting circuit portion LC may be disposed to overlap the data driver DDV in the plan view, for example. However, the configuration of the disclosure is not limited thereto, and the lighting circuit portion LC may be disposed not to overlap with the data driver DDV. The lighting circuit portion LC may provide the lighting inspection signal received from the pad portion PD to the plurality of pixels PX. A detailed description of the lighting circuit portion LC will be described later.

The display device DD may further include a data line DL, a scan line SL, an emission control line EL, a driving voltage line PL, a signal transmission line TL, an inspection signal line LSL, a first line LN1, and a second line LN2 disposed on the substrate SUB.

The data line DL, the scan line SL, the emission control line EL, and the driving voltage line PL may be disposed in the display area DA and connected to the plurality of pixels PX. The first line LN1 may be disposed in the first and second peripheral areas PA1 and PA2 and may be connected to the scan driver SDV. The second line LN2 may be disposed in the first and second peripheral areas PA1 and PA2 and connected to the emission driver EDV. The inspection signal line LSL may be disposed in the second peripheral area PA2 and connected to the lighting circuit portion LC.

The signal transmission line TL may be electrically connected to the data driver DDV and may extend along the first direction D1. In addition, the signal transmission line TL may be connected to the data line DL extending in the first direction D1. The signal transmission line TL may receive the data voltage from the data driver DDV and provide the data voltage to the data line DL. In this case, the data line DL may provide the data voltage to the plurality of pixels PX.

The signal transmission line TL may also be electrically connected to the lighting circuit portion LC. Accordingly, the data line DL may be electrically connected to the lighting circuit portion LC. In the inspection step of the display device DD, the signal transmission line TL may receive the lighting inspection signal from the lighting circuit portion LC and provide the lighting inspection signal to the data line DL. In this case, the data line DL may provide the lighting inspection signal to the plurality of pixels PX.

The scan line SL may be electrically connected to the scan driver GDV and may extend in a second direction D2 crossing the first direction D1. The scan line SL may receive the scan signal from the scan driver SDV and provide the scan signal to the plurality of pixels PX.

The emission control line EL may be electrically connected to the emission driver EDV and may extend along the second direction D2. The emission control line EL may receive the emission control signal from the emission driver EDV and provide the emission control signal to the plurality of pixels PX. In an embodiment, an active period of the emission control signal may be an emission period of the display device DD, and an inactive period of the emission control signal may be a non-emission period of the display device DD, for example.

The driving voltage line PL may be connected to the pad portion PD and may extend along the first direction D1. The driving voltage line PL may receive a driving voltage from the pad portion PD and provide the driving voltage to the plurality of pixels PX.

The first line LN1 may be electrically connected to the pad portion PD. The first line LN1 may receive the scan start signal or the like from the pad portion PD and provide the scan start signal or the like to the scan driver SDV.

The second line LN2 may be electrically connected to the pad portion PD. The second line LN2 may receive the emission start signal or the like from the pad portion PD, and provide the emission start signal or the like to the emission driver EDV.

The inspection signal line LSL may be electrically connected to the pad portion PD. The inspection signal line LSL may receive the lighting inspection signal from the pad portion PD and provide the lighting inspection signal to the lighting circuit portion LC.

In FIG. 1, the scan driver SDV and the emission driver EDV are disposed in the first peripheral area PA1 adjacent to a left side of the display area DA and the first peripheral area PA1 adjacent to the right side of the display area DA, respectively. However, the disclosure is not limited thereto. The scan driver SDV and the light-emitting driver EDV may be disposed at different position of the first peripheral area PA1. In an embodiment, both the scan driver SDV and the emission driver EDV may be disposed in the first peripheral area PA1 adjacent to the left or right side of the display area DA, for example.

In addition, although the data driver DDV is illustrated as being disposed (e.g., mounted) in the second peripheral area PA2 of the display device DD in FIG. 1, the disclosure is not limited thereto. In an embodiment, a separate flexible printed circuit board ("FPCB") may be disposed in the second peripheral area PA2, and the data driver DDV may be disposed on the flexible printed circuit board, for example. In this case, the pad portion PD may be electrically connected to the flexible printed circuit board.

In this specification, a plane may be defined as the first direction D1 and the second direction D2 crossing the first direction D1. In an embodiment, the second direction D2 may be perpendicular to the first direction D1, for example.

Figure 2:
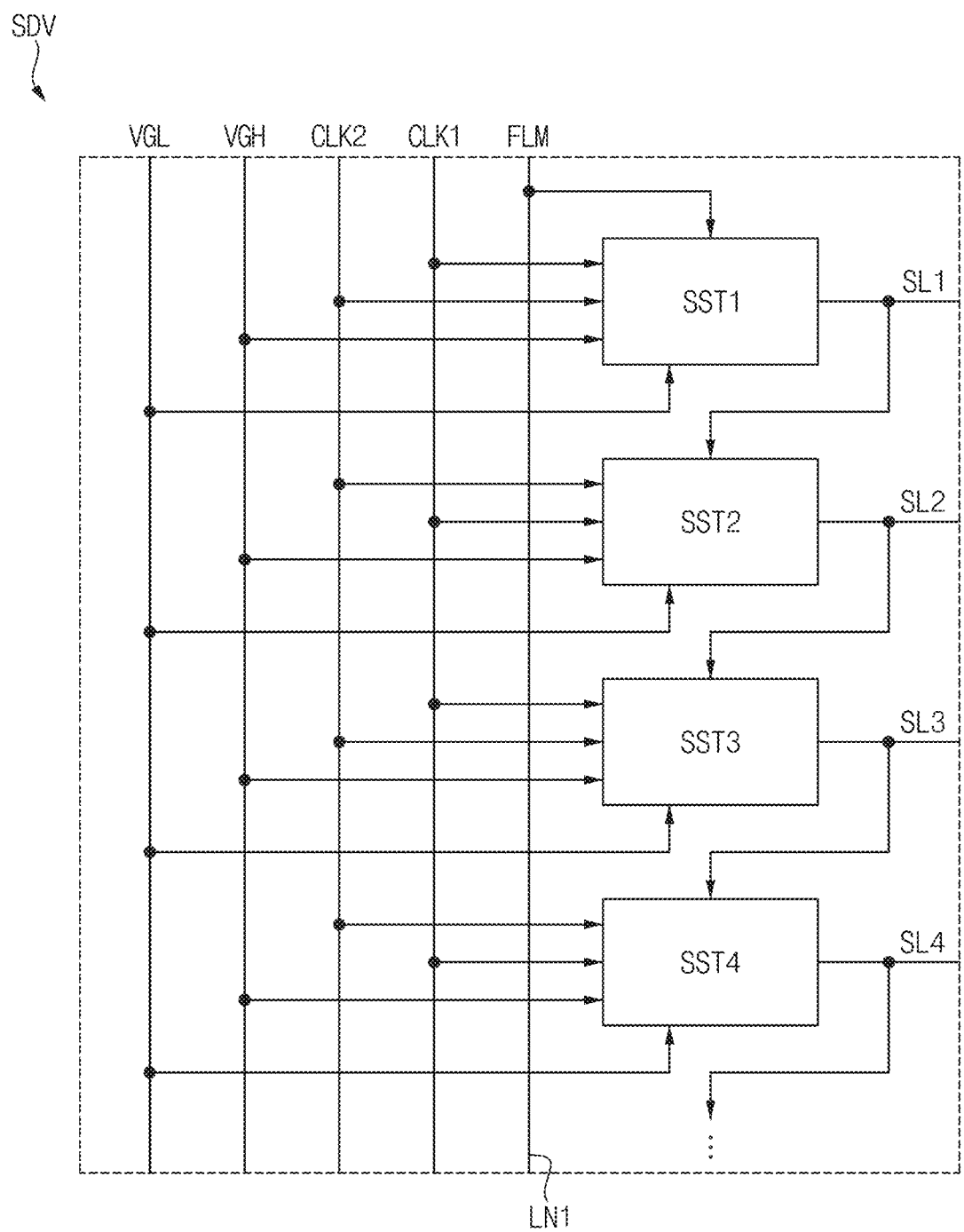
FIG. 2 is a view illustrating an embodiment of a scan driver of FIG. 1.
Figure 3:
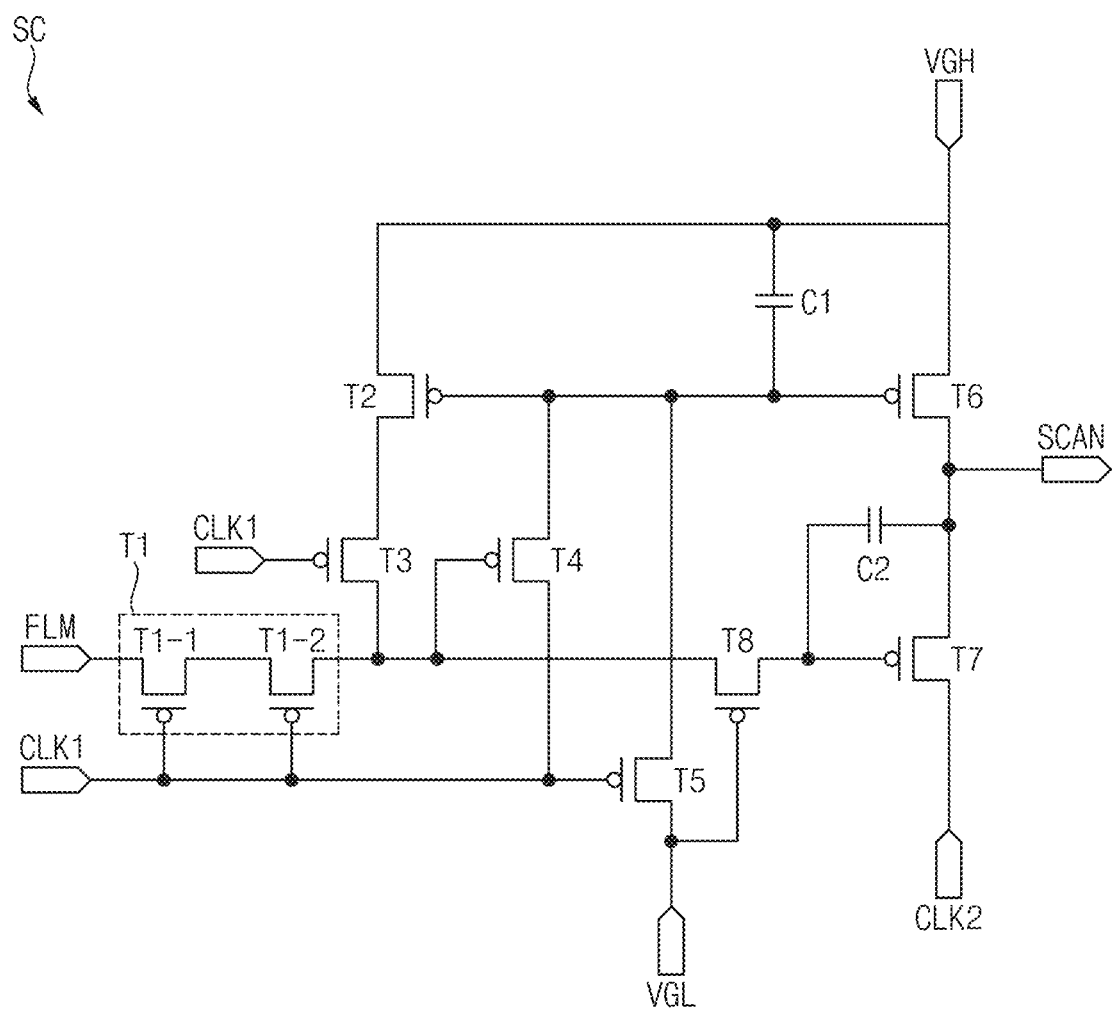
FIG. 3 is a view illustrating an embodiment of a scan driving circuit incorporated in the scan driver of FIG. 2.

FIG. 2 is a view illustrating an embodiment of a scan driver of FIG. 1. FIG. 3 is a view illustrating an embodiment of a scan driving circuit incorporated in the scan driver of FIG. 2.

Referring to FIGS. 2 and 3, the scan driver SDV may include a plurality of scan shift registers SST1, SST2, SST3, and SST4. In an embodiment, the plurality of scan shift registers SST1, SST2, SST3, and SST4 may be connected to a plurality of scan lines SL1, SL2, SL3, and SL4, respectively, for example.

The plurality of scan shift registers SST1, SST2, SST3, and SST4 may output a plurality of scan signals in response to a first voltage VGH, a second voltage VGL, at least one clock signal CLK1, CLK2, and a scan start signal FLM. The plurality of scan signals may be applied to the plurality of scan lines SL1, SL2, SL3, and SL4, respectively. The scan start signal FLM may be applied to the first scan shift register SST1.

Each of the plurality of scan shift registers SST1, SST2, SST3, and SST4 may include a scan driving circuit SC. In an embodiment, the scan driving circuit SC may include first, second, third, fourth, fifth, sixth, seventh, and eighth scan driver transistors T1, T2, T3, T4, T5, T6, T7, and T8, a first capacitor C1, and a second capacitor C2, for example. Each of the first, second, third, fourth, fifth, sixth, seventh, and eighth scan driver transistors T1, T2, T3, T4, T5, T6, T7, and T8 may be also referred to as a driver transistor.

In an embodiment, the first scan driver transistor T1 that directly receives the scan start signal FLM through the first line LN1 among the first, second, third, fourth, fifth, sixth, seventh, and eighth scan driver transistors T1, T2, T3, T4, T5, T6, T7, and T8 may have a dual transistor structure in which two transistors are connected in series with each other. That is, the first scan driver transistor T1 may be directly connected to the first line LN1 that applies the scan start signal FLM. Specifically, the first scan driver transistor T1 may include a (1-1)th scan driver transistor T1-1 and a (1-2)th scan driver transistor T1-2 connected in series with each other and controlled by the same first clock signal CLK1. However, the configuration of the disclosure is not limited thereto, and the first scan driver transistor T1 may have a triple transistor structure in which three transistors are connected in series with each other or a multi-transistor structure in which four or more transistors are connected in series with each other.

In another embodiment, at least one of the second, third, fourth, fifth, sixth, seventh, and eighth scan driver transistors T2, T3, T4, T5, T6, T7, and T8 may have a dual transistor structure in which two transistors are connected in series with each other, a triple transistor structure in which three transistors are connected in series with each other, or a multi-transistor structure in which four or more transistors are connected in series with each other.

Although the scan driving circuit SC is illustrated as including eight driver transistors and two capacitors in FIG. 3, the configuration of the disclosure is not limited thereto.

Figure 4:
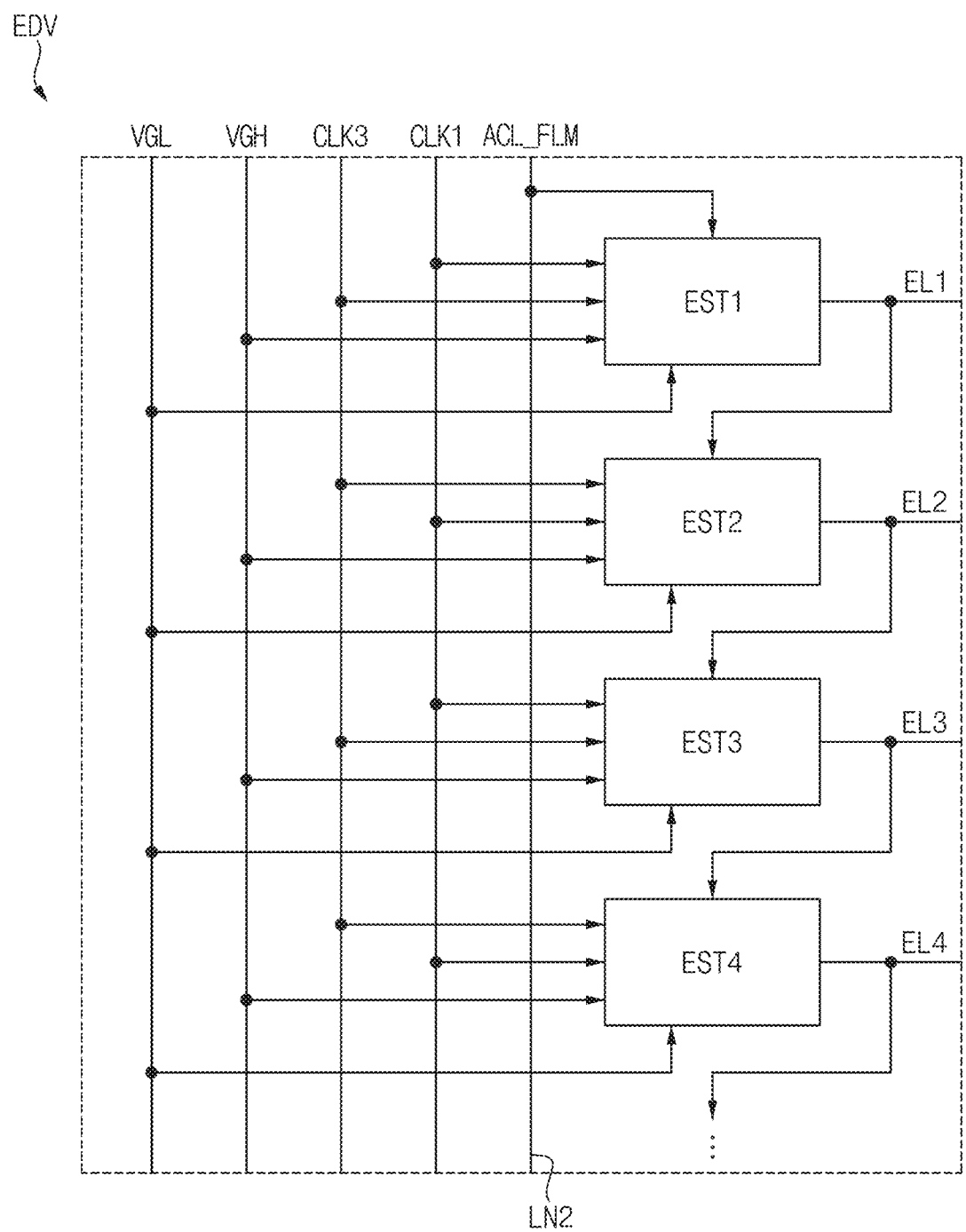
FIG. 4 is a view illustrating an embodiment of an emission driver of FIG. 1.
Figure 5:
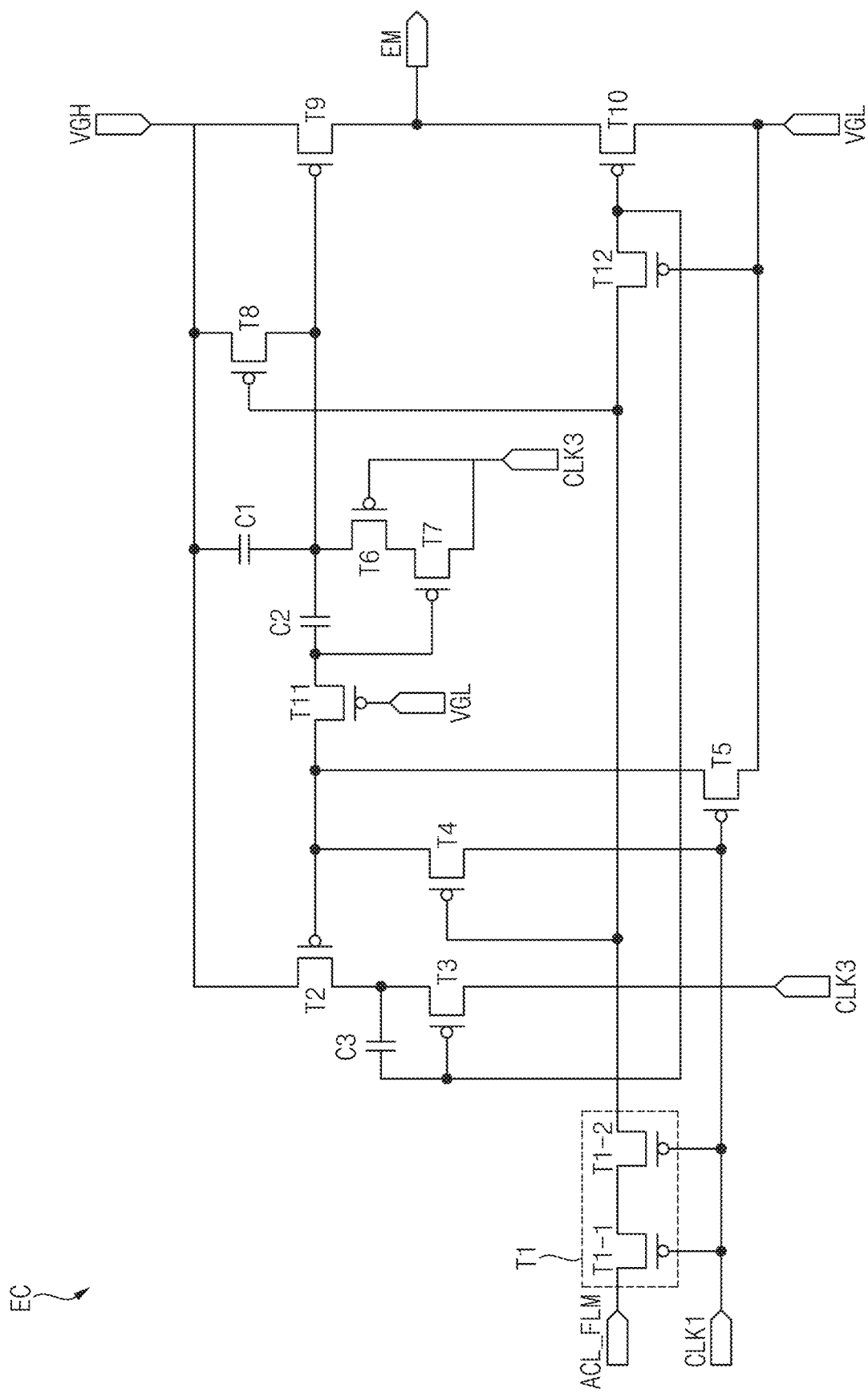
FIG. 5 is a view illustrating an embodiment of an emission driving circuit incorporated in the emission driver of FIG. 4.

FIG. 4 is a view illustrating an embodiment of an emission driver of FIG. 1. FIG. 5 is a view illustrating an embodiment of an emission driving circuit incorporated in the emission driver of FIG. 4.

Referring to FIGS. 4 and 5, the emission driver EDV may include a plurality of emission shift registers EST1, EST2, EST3, and EST4. In an embodiment, the plurality of emission shift registers EST1, EST2, EST3, and EST4 may be connected to a plurality of emission control lines EL1, EL2, EL3, and EL4, respectively.

The plurality of emission shift registers EST1, EST2, EST3, and EST4 may output a plurality of emission control signals in response to a first voltage VGH, a second voltage VGL, at least one clock signals CLK1 and CLK3, and the emission start signal ACL_FLM. The plurality of light-emitting control signals may be applied to the plurality of light-emitting control lines ELL EL2, EL3, and EL4, respectively. The emission start signal ACL_FLM may be applied to the first emission shift register EST1.

Each of the emission shift registers EST1, EST2, EST3, and EST4 may include an emission driving circuit EC. In an embodiment, the emission driving circuit EC may include first, second, third, fourth, fifth, sixth, seventh, eighth, ninth, tenth, eleventh, and twelfth transistors T1, T2, T3, T4, T5, T6, T7, T8, T9, T10, T11, and T12 and first, second, and third capacitors C1, C2, and C3. Each of the first, second, third, fourth, fifth, sixth, seventh, eighth, ninth, tenth, eleventh, and twelfth emission transistors T1, T2, T3, T4, T5, T6, T7, T8, T9, T10, T11, and T12 may be also referred to as a driver transistor, for example.

In an embodiment, the first emission driver transistor T1 that directly receives the emission start signal ACL_FLM among the first, second, third, fourth, fifth, sixth, seventh, eighth, ninth, tenth, eleventh, and twelfth emission transistors T1, T2, T3, T4, T5, T6, T7, T8, T9, T10, T11, and T12 may have a dual transistor structure in which two transistors are connected in series with each other. That is, the first emission driver transistor T1 may be directly connected to the second line LN2 that applies the emission start signal ACL_FLM. Specifically, the first emission driver transistor T1 may include a (1-1)th emission driver transistor T1-1 and a (1-2)th emission driver transistor T1-2 connected in series with each other and controlled by the same first clock signal CLK1. However, the configuration of the disclosure is not limited thereto, and the first emission driver transistor T1 may have a triple transistor structure in which three transistors are connected in series with each other or a multi-transistor structure in which four or more transistors are connected in series with each other.

In another embodiment, at least one of the second, third, fourth, fifth, sixth, seventh, eighth, ninth, tenth, eleventh, and twelfth emission transistors T2, T3, T4, T5, T6, T7, T8, T9, T10, T11, and T12 may have a dual transistor in which two transistors are connected in series with each other, a triple transistor structure in which three transistors are connected in series with each other, or a multi-transistor structure in which four or more transistors are connected in series with each other.

Although the emission driving circuit EC is illustrated as including twelve driver transistors and three capacitors in FIG. 5, the configuration of the disclosure is not limited thereto.

Figure 6:
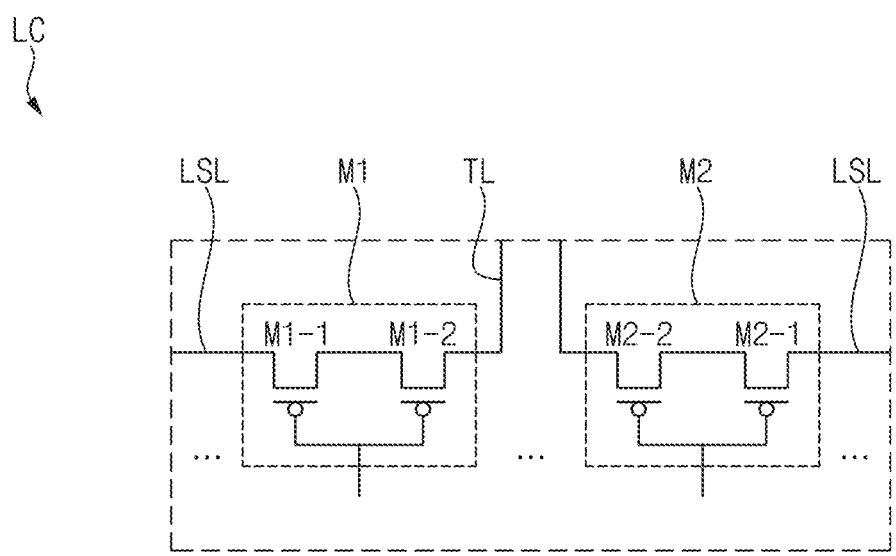
FIG. 6 is a view illustrating an embodiment of a lighting circuit portion of FIG. 1.

FIG. 6 is a view illustrating an embodiment of a lighting circuit portion of FIG. 1.

Referring to FIGS. 1 and 6, the lighting circuit portion LC may include at least one lighting circuit portion transistors M1 and M2. In an embodiment, the at least one of the lighting circuit portion transistors M1 and M2 may include a first lighting circuit portion transistor M1 and a second lighting circuit portion transistor M2 that are directly connected to the inspection signal line LSL that applies the lighting inspection signal. That is, each of the first lighting circuit portion transistor M1 and the second lighting circuit portion transistor M2 may receive the lighting inspection signal directly. In other words, a source electrode of each of the first lighting circuit portion transistor M1 and the second lighting circuit portion transistor M2 may include a portion of the inspection signal line LSL.

In an embodiment, each of the first lighting circuit portion transistor M1 and the second lighting circuit portion transistor M2 may have the same structure as the first scan driver transistor T1 of the scan driver SDV illustrated in FIG. 3 and the first emission driver transistor T1 of the light-emitting driver EDV illustrated in FIG. 5. That is, each of the first lighting circuit portion transistor M1 and the second lighting circuit portion transistor M2 may have a dual transistor structure in which two transistors are connected in series with each other, a triple transistor structure in which three transistors are connected in series with each other, or multi-transistor structure in which four or more transistors are connected in series with each other. In an embodiment, as illustrated in FIG. 6, when each of the first lighting circuit portion transistor M1 and the second lighting circuit portion transistor M2 has a dual transistor structure, the first lighting circuit portion transistor M1 may include a (1-1)th lighting circuit portion transistor M1-1 and a (1-2)th lighting circuit portion transistor M1-2 connected in series with each other and controlled by the same control signal and the second lighting circuit portion transistor M2 may include a (2-1)th lighting circuit portion transistor M2-1 and a (2-2)th lighting circuit portion transistor M2-2 connected in series with each other and controlled by the same control signal, for example, for example.

Figure 7:
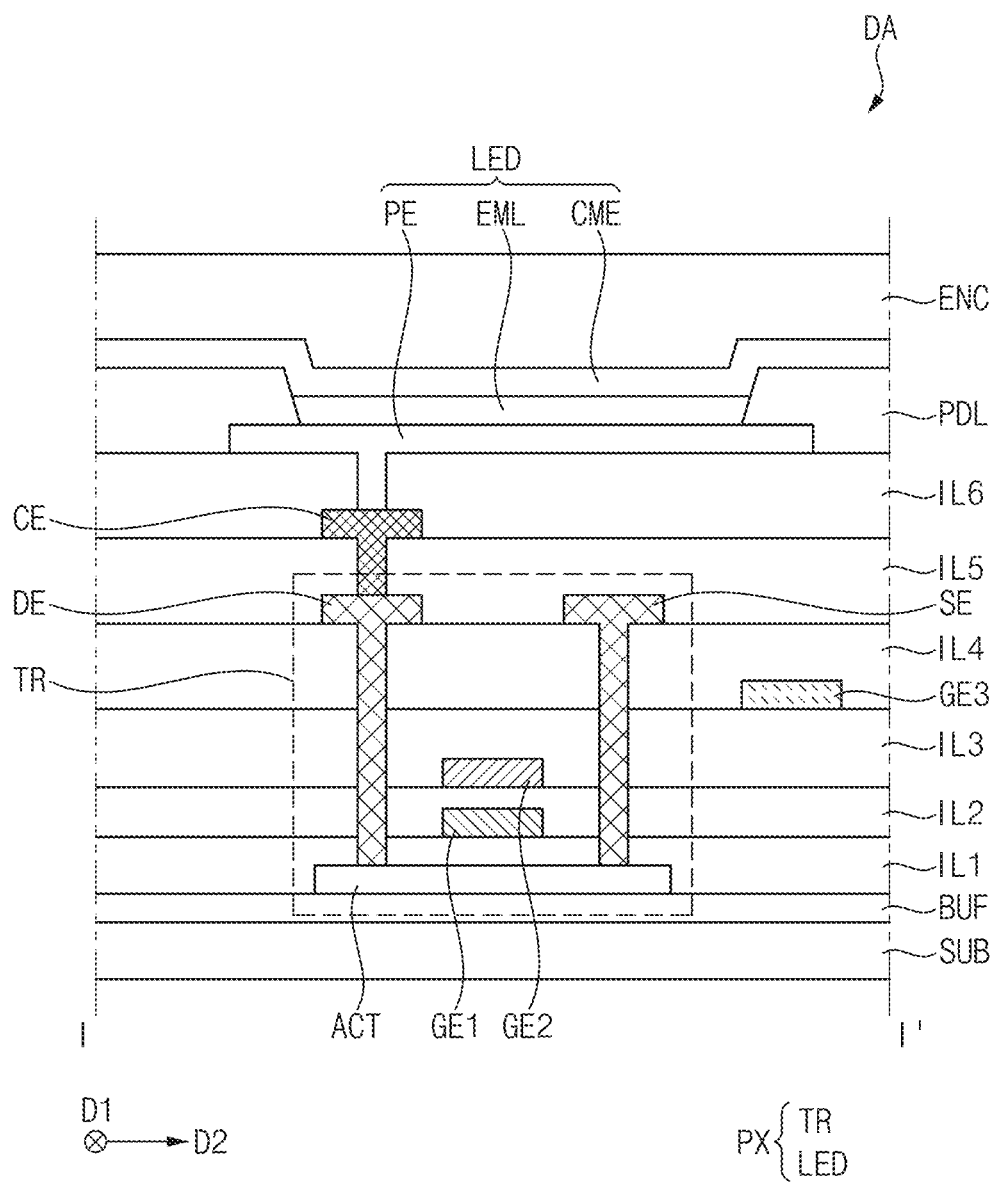
FIG. 7 is a cross-sectional view taken along line I-I' of FIG. 1.

FIG. 7 is a cross-sectional view taken along line I-I' of FIG. 1. In an embodiment, FIG. 7 is a cross-sectional view illustrating a portion of the display area DA of the display device DD of FIG. 1, for example.

Referring to FIG. 7, the display device DD in an embodiment includes a substrate SUB, a buffer layer BUF, a pixel transistor TR, a second gate electrode GE2, a third gate electrode GE3, first, second, third, fourth, fifth, and sixth insulating layers IL1, IL2, IL3, IL4, IL5, and IL6, a connection electrode CE, a pixel defining layer PDL, an emission element LED, and an encapsulation layer ENC.

Here, the pixel transistor TR may include an active layer ACT, a first gate electrode GE1, a source electrode SE, and a drain electrode DE. The emission element LED may include a pixel electrode PE, an emission layer EML, and a common electrode CME.

The substrate SUB may include a transparent material or an opaque material. The substrate SUB may include a transparent resin substrate. In embodiments, the transparent resin substrate include polyimide substrates or the like. In this case, the polyimide substrate may include a first organic layer, a first barrier layer, and a second organic layer. In an alternative embodiment, the substrate SUB may include a quartz substrate, a synthetic quartz substrate, a calcium fluoride substrate, an F-doped quartz substrate, a soda-lime glass substrate, a non-alkali glass substrate, or the like. These may be used alone or in any combinations with each other.

The buffer layer BUF may be disposed on the substrate SUB. The buffer layer BUF may prevent diffusion of metal atoms or impurities from the substrate SUB to a transistor (e.g., the pixel transistor TR). In addition, the buffer layer BUF may improve flatness of the surface of the substrate SUB when the surface of the substrate SUB is not uniform. In an embodiment, the buffer layer BUF may include an inorganic material such as silicon oxide, silicon nitride, silicon oxynitride, or the like, for example. These may be used alone or in any combinations with each other.

The active layer ACT may be disposed on the buffer layer BUF. Each of the active layer ACT may include a metal oxide semiconductor, an inorganic semiconductor (e.g., amorphous silicon, poly silicon), or an organic semiconductor. The active layer ACT may include a source region, a drain region, and a channel region disposed between the source region and the drain region.

The metal oxide semiconductor may include a two-component compound ("$AB_x$"), a ternary compound ("$AB_xC_y$"), a four-component compound ("$AB_xC_yD_z$"), or the like including or consisting of indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like. In an embodiment, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), or the like, for example. These may be used alone or in any combinations with each other.

The first insulating layer IL1 may be disposed on the buffer layer BUF. The first insulating layer IL1 may cover the active layer ACT. In an embodiment, the first insulating layer IL1 may include an inorganic material such as silicon oxide ("SiO$_x$"), silicon nitride ("SiN$_x$"), silicon carbide ("SiC$_x$"), silicon oxynitride ("SiO$_x$N$_y$"), silicon oxycarbide ("SiO$_x$C$_y$"), or the like, for example. These may be used alone or in any combinations with each other.

The first gate electrode GE1 may be disposed on the first insulating layer ILL The first gate electrode GE1 may overlap the channel region of the active layer ACT. In an embodiment, the first gate electrode GE1 may include a metal, an alloy metal nitride, a conductive metal oxide, a transparent conductive material, or the like. In embodiments, the metal include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. In embodiments, the conductive metal oxide may include indium tin oxide and indium zinc oxide. In addition, embodiments of the metal nitride may include aluminum nitride ("AlN$_x$"), tungsten nitride ("WN$_x$"), chromium nitride ("CrN$_x$"), or the like.

These may be used individually or in any combinations with each other. The second insulating layer IL2 may be disposed on the first insulating layer IL1 and the first gate electrode GE1. The second insulating layer IL2 may cover the first gate electrode GE1. In an embodiment, the second insulating layer IL2 may include an inorganic material such as silicon oxide ("SiO$_x$"), silicon nitride ("SiN$_x$"), silicon carbide ("SiC$_x$"), silicon oxynitride ("SiO$_x$N$_y$"), silicon oxycarbide ("SiO$_x$C$_y$"), or the like, for example. These may be used alone or in any combinations with each other.

The second gate electrode GE2 may be disposed on the second insulating layer IL2. The second gate electrode GE2 may overlap the first gate electrode GE1. In an embodiment, the second gate electrode GE2 may include a metal, an alloy metal nitride, a conductive metal oxide, a transparent conductive material, or the like, for example. These may be used alone or in any combinations with each other.

The third insulating layer IL3 may be disposed on the second insulating layer IL2 and the second gate electrode GE2. The third insulating layer IL3 may cover the second gate electrode GE2. In an embodiment, the third insulating layer IL3 may include an inorganic material such as silicon oxide ("SiO$_x$"), silicon nitride ("SiN$_x$"), silicon carbide ("SiC$_x$"), silicon oxynitride ("SiO$_x$N$_y$"), silicon oxycarbide ("SiO$_x$C$_y$"), or the like, for example. These may be used alone or in any combinations with each other.

The third gate electrode GE3 may be disposed on the third insulating layer IL3. The third gate electrode GE3 may include a portion of a signal line that provides various signals. In an embodiment, the third gate electrode GE3 may include a metal, an alloy metal nitride, a conductive metal oxide, a transparent conductive material, or the like, for example. These may be used alone or in any combinations with each other.

The fourth insulating layer IL4 may be disposed on the third insulating layer IL3 and the third gate electrode GE3. The fourth insulating layer IL4 may cover the third gate electrode GE3. In an embodiment, the fourth insulating layer IL4 may include an inorganic material such as silicon oxide ("SiO$_x$"), silicon nitride ("SiN$_x$"), silicon carbide ("SiC$_x$"), silicon oxynitride ("SiO$_x$N$_y$"), silicon oxycarbide ("SiO$_x$C$_y$"), or the like, for example. These may be used alone or in any combinations with each other.

The source electrode SE and a drain electrode DE may be disposed on the fourth insulating layer IL4. The source electrode SE may be connected to the source region of the active layer ACT through a contact hole penetrating a first portion of the first, second, third, and fourth insulating layers IL1, IL2, IL3, and IL4. The drain electrode DE may be connected to the drain region of the active layer ACT through a contact hole penetrating a second portion of the first, second, third, and fourth insulating layers IL1, IL2, IL3, and IL4. In an embodiment, each of the source electrode SE and the drain electrode DE may include a metal, an alloy, a metal nitride, a conductive metal oxide, a transparent conductive material, or the like, for example. These may be used alone or in any combinations with each other. These may be used alone or in any combinations with each other.

The fifth insulating layer IL5 may be disposed on the fourth insulating layer IL4, the source electrode SE, and the drain electrode DE. The fifth insulating layer IL5 may cover the source electrode SE and the drain electrode DE. The fifth insulating layer IL5 may include an inorganic material or an organic material. In an embodiment, the fifth insulating layer IL5 may include an organic material. In an embodiment, the fifth insulating layer IL5 may include an organic material such as phenolic resin, polyacrylates resin, polyimides rein, polyamides resin, siloxane resin, an epoxy resin, or the like, for example. These may be used alone or in any combinations with each other.

Accordingly, the pixel transistor TR including the active layer ACT, the first gate electrode GE1, the source electrode SE, and the drain electrode DE may be disposed in the display area DA on the substrate SUB.

The connection electrode CE may be disposed on the fifth insulating layer IL5. The connection electrode CE may be connected to the drain electrode DE through a contact hole penetrating a portion of the fifth insulating layer IL5. In an embodiment, the connection electrode CE may include a metal, an alloy, a metal nitride, a conductive metal oxide, a transparent conductive material, or the like, for example. These may be used alone or in any combinations with each other.

The sixth insulating layer IL6 may be disposed on the fifth insulating layer IL5 and the connection electrode CE. The sixth insulating layer IL6 may cover the connection electrode CE. The sixth insulating layer IL6 may include an inorganic material or an organic material. In an embodiment, the sixth insulating layer IL6 may include an organic material. In an embodiment, the sixth insulating layer IL6 may include an organic material such as a phenol resin, an acrylic resin, a polyimide resin, a polyamide resin, a siloxane resin, an epoxy resin, or the like, for example. These may be used alone or in any combinations with each other.

The pixel electrode PE may be disposed on the sixth insulating layer IL6. The pixel electrode PE may be connected to the connection electrode CE through a contact hole penetrating a portion of the sixth insulating layer IL6. In an embodiment, the pixel electrode PE may include a metal, an alloy, a metal nitride, a conductive metal oxide, a transparent conductive material, or the like, for example. These may be used alone or in any combinations with each other. In an embodiment, the pixel electrode PE may function as an anode, for example.

The pixel defining layer PDL may be disposed on the sixth insulating layer IL6 and the pixel electrode PE. The pixel defining layer PDL may cover opposite sides of the pixel electrode PE. In addition, an opening exposing a portion of an upper surface of the pixel electrode PE may be defined in the pixel defining layer PDL. In an embodiment, the pixel defining layer PDL may include an inorganic material or an organic material, for example. In an embodiment, the pixel defining layer PDL may include an organic material such as an epoxy resin, a siloxane resin, or the like. These may be used alone or in any combinations with each other. In another embodiment, the pixel defining layer PDL may include an organic material including or consisting of a light-blocking material such as black pigment, black dye, or the like.

The emission layer EML may be disposed on the pixel electrode PE. The emission layer EML may include an organic material that emits light of a predetermined color. In an embodiment, the emission layer EML may include an organic material that emits at least one of red light, green light, and blue light, for example.

The common electrode CME may be disposed on the pixel defining layer PDL and the emission layer EML. In an embodiment, the common electrode CME may include a metal, an alloy, a metal nitride, a conductive metal oxide, a transparent conductive material, or the like, for example. These may be used alone or in any combinations with each other. In an embodiment, the common electrode CME may operate as a cathode.

Accordingly, the emission element (also referred to as an emission device) LED including the pixel electrode PE, the emission layer EML, and the common electrode CME may be disposed in the display area DA on the substrate SUB.

The encapsulation layer ENC may be disposed on the common electrode CME. The encapsulation layer ENC may prevent impurities, moisture, air, or the like from permeating the emission element LED from the outside. The encapsulation layer ENC may include at least one inorganic layer and at least one organic layer. In an embodiment, the inorganic layer may include silicon oxide, silicon nitride, silicon oxynitride, or the like, for example. These may be used alone or in any combinations with each other. The organic layer may include a polymer cured material such as polyacrylate or the like.

Figure 8:
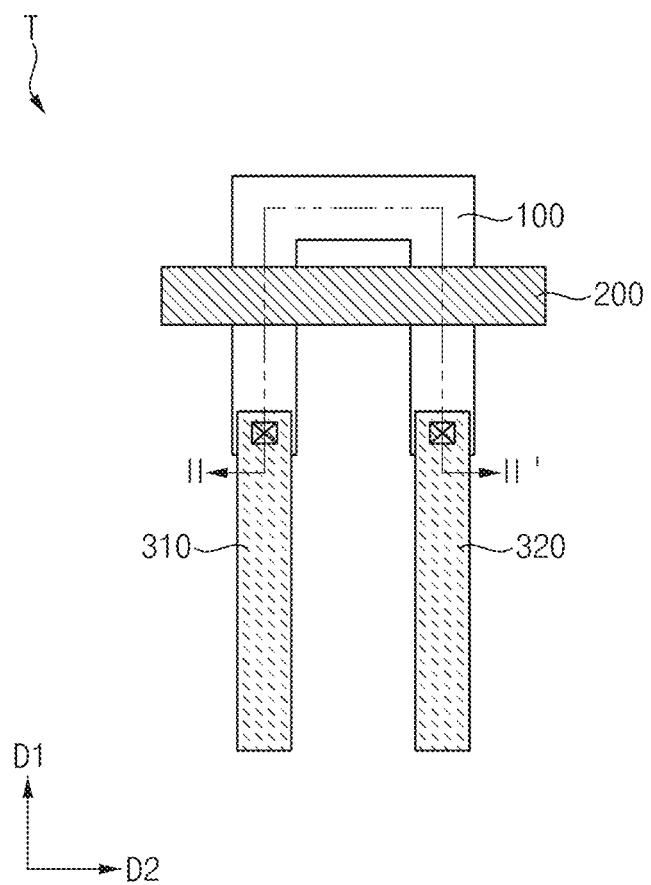
FIG. 8 is a plan view illustrating an embodiment of a transistor disposed in a peripheral area of a display device according to the disclosure.
Figure 9:
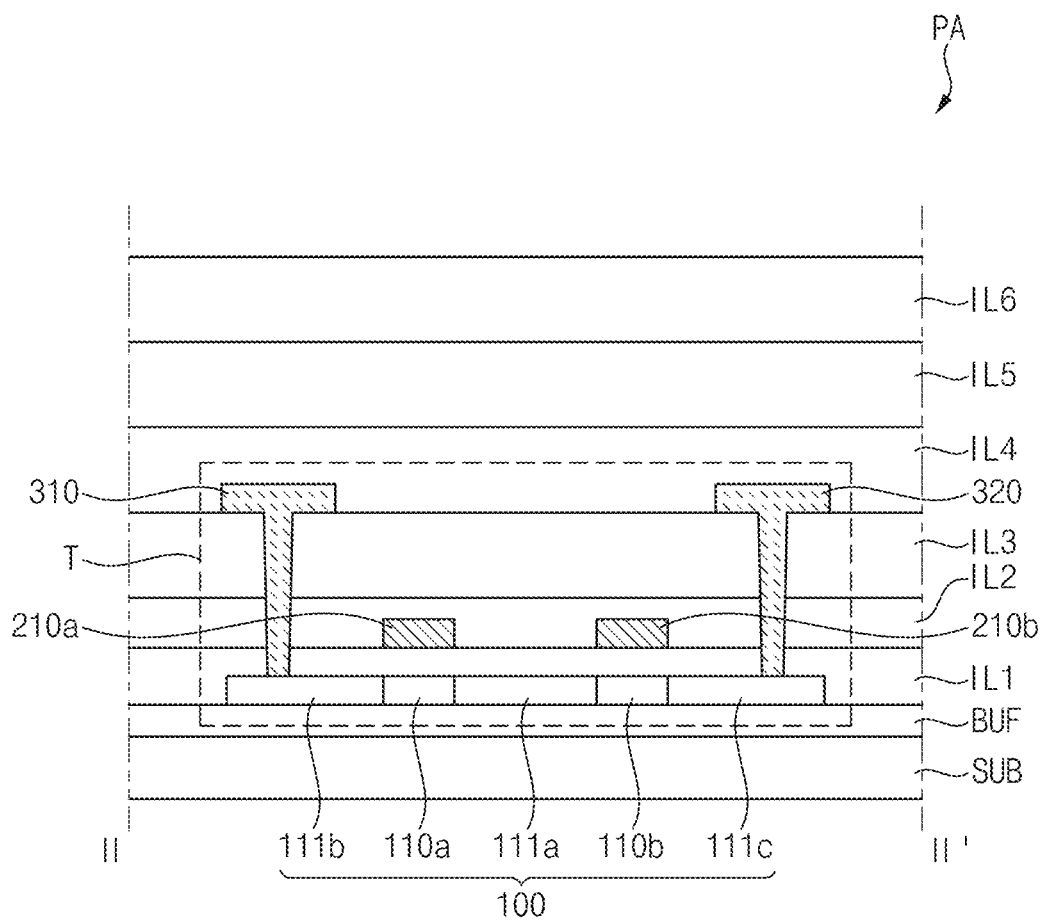
FIG. 9 is a cross-sectional view illustrating an embodiment of a cross section taken along line II-II' of FIG. 8.
Figure 10:
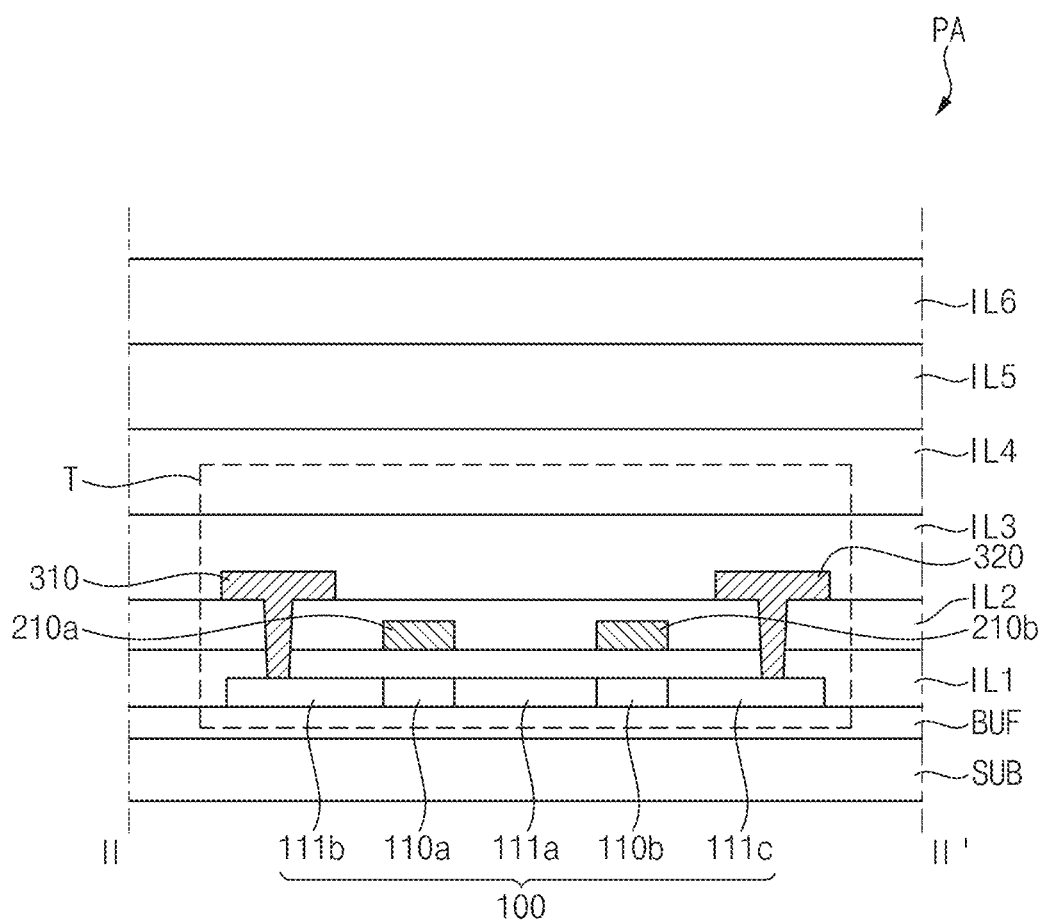
FIG. 10 is a cross-sectional view illustrating another embodiment of a cross section taken along line II-II' of FIG. 8.

FIG. 8 is a plan view illustrating an embodiment of a transistor disposed in a peripheral area of a display device according to the disclosure. FIG. 9 is a cross-sectional view illustrating an embodiment of a cross section taken along line II-II' of FIG. 8. FIG. 10 is a cross-sectional view illustrating another embodiment of a cross section taken along line II-II' of FIG. 8.

Referring to FIGS. 8, 9 and 10, the display device DD in an embodiment of the disclosure may include a peripheral transistor T disposed in the peripheral area PA on the substrate SUB. Hereinafter, descriptions overlapping those of the display device DD described with reference to FIG. 7 will be omitted or simplified.

In an embodiment, the peripheral transistor T may have a dual transistor structure in which two transistors operated by the same control signal are connected in series with each other. In an embodiment, the peripheral transistor T illustrated in FIGS. 8, 9, and 10 may correspond to at least one of the first scan driver transistor T1 illustrated in FIG. 3, the first emission driver transistor T1 illustrated in FIG. 5, and the lighting circuit portion transistors M1 and M2 illustrated in FIG. 6, for example. In another embodiment, the peripheral transistor T may correspond to at least one of the second, third, fourth, fifth, sixth, seventh, and eighth scan driver transistors T2, T3, T4, T5, T6, T7, and T8 illustrated in FIG. 3 and the second, third, fourth, fifth, sixth, seventh, eighth, ninth, tenth, eleventh, and twelfth emission transistors T2, T3, T4, T5, T6, T7, T8, T9, T10, T11, and T12 illustrated in FIG. 5.

The peripheral transistor T may include an active pattern 100, a gate line 200, a first electrode pattern 310, and a second electrode pattern 320.

The active pattern 100 may be disposed on the substrate SUB. In an embodiment, the active pattern 100 may include a metal oxide semiconductor, an inorganic semiconductor (e.g., amorphous silicon, poly silicon), or an organic semiconductor, for example. That is, the active pattern 100 may include the same material as that of the active layer ACT illustrated in FIG. 7.

The active pattern 100 may include a first region 111a, a second region 111b, a third region 111c, a first channel region 110a, and a second channel region 110b. The first channel region 110a may be disposed between the first region 111a and the second region 111b, and the second channel region 110b may be disposed between the first region 111a and the third region 111c. Impurities may be doped in the first, second, and third regions 111a, 111b, and 111c. In an embodiment, the first region 111a may be a source region, and the third region 111c may be a drain region, for example. In an alternative embodiment, the first region 111a may be a drain region, and the third region 111c may be a source region.

In an embodiment, the active pattern 100 may have a "ㄷ" shape in a plan view. That is, the active pattern 100 may have a quadrangular (e.g., rectangular) shape with one side open in the plan view. However, the configuration of the disclosure is not limited thereto, and the active pattern 100 may have various planar shapes.

The gate line 200 may be disposed on the first insulating layer IL1. The gate line 200 may include the same material as that of the first gate electrode GE1 illustrated in FIG. 7 and may be disposed in the same layer as the first gate electrode GE1 illustrated in FIG. 7. In an embodiment, the gate line 200 may include a metal, an alloy, a metal nitride, a conductive metal oxide, a transparent conductive material, or the like, for example. These may be used alone or in any combinations with each other.

The gate line 200 may include a first gate pattern 210a and a second gate pattern 210b. The first gate pattern 210a may overlap the first channel region 110a of the active pattern 100, and the second gate pattern 210b may overlap the second channel region 110b of the active pattern 100.

The first electrode pattern 310 and the second electrode pattern 320 may be disposed on the third insulating layer IL3. In the plan view, each of the first electrode pattern 310 and the second electrode pattern 320 may extend in a direction (e.g., the first direction D1) perpendicular to a direction (e.g., the second direction D2) in which the gate line 200 extends.

In an embodiment, as illustrated in FIG. 9, the first electrode pattern 310 may be connected to the second region 111b of the active pattern 100 through a contact hole penetrating a first portion of the first, second, and third insulating layers IL1, IL2, and IL3 and the second electrode pattern 320 may be connected to the third region 111c of the active pattern 100 through a contact hole penetrating a second portion of the first, second, and third insulating layers IL1, IL2, and IL3. In this case, the first electrode pattern 310 and the second electrode pattern 320 may include the same material as that of the third gate electrode GE3 illustrated in FIG. 7 and may be disposed in the same layer as the third gate electrode GE3 illustrated in FIG. 7.

In another embodiment, as illustrated in FIG. 10, the first electrode pattern 310 may be connected to the second region 111b of the active pattern 100 through a contact hole penetrating a first portion of the first and second insulating layers IL1 and IL2 and the second electrode pattern 320 may be connected to the third region 111c of the active pattern 100 through a contact hole penetrating a second portion of the first and second insulating layers IL1 and IL2. In this case, the first electrode pattern 310 and the second electrode pattern 320 may include the same material as that of the second gate electrode GE2 illustrated in FIG. 7 and may be disposed in the same layer as the second gate electrode GE2 illustrated in FIG. 7.

However, the configuration of the disclosure is not limited thereto, and the first electrode pattern 310 and the second electrode pattern 320 may be disposed in different layers. In an embodiment, the first electrode pattern 310 and the second electrode pattern 320 may include the same material as that of the source electrode SE and the drain electrode DE illustrated in FIG. 7 and may be disposed in the same layer as the source electrode SE and the drain electrode DE illustrated in FIG. 7, for example.

In an embodiment, the first electrode pattern 310 may be a source electrode, and the second electrode pattern 320 may be a drain electrode. In an embodiment, when the peripheral transistor T corresponds to the first scan driver transistor T1 illustrated in FIG. 3, the first electrode pattern 310 may include a portion of a first line (e.g., the first line LN1 of FIGS. 1 and 2) that applies the scan start signal to a scan driver (e.g., the scan driver SDC of FIGS. 1 and 2), for example. That is, the peripheral transistor T may be directly connected to the first line.

In an embodiment, when the peripheral transistor T corresponds to the first emission driver transistor T1 illustrated in FIG. 5, the first electrode pattern 310 may include a portion of a second line (e.g., the second line LN2 of FIGS. 1 and 4) that applies the emission start signal to an emission driver (e.g., the emission driver EDV of FIGS. 1 and 2), for example. That is, the peripheral transistor T may be directly connected to the second line.

In an embodiment, when the peripheral transistor T corresponds to the lighting circuit portion transistors M1 and M2 illustrated in FIG. 6, the first electrode pattern 310 may include a portion of an inspection signal line (e.g., the inspection signal line LSL of FIGS. 1 and 6) that applies the lighting inspection signal to a lighting circuit portion (e.g., the lighting circuit portion of FIGS. 1 and 6), for example. That is, the peripheral transistor T may be directly connected to the inspection signal line.

In another embodiment, the first electrode pattern 310 may be a drain electrode, and the second electrode pattern 320 may be a source electrode. In this case, as described in the case where the first electrode pattern 310 is the source electrode, the second electrode pattern 320 may include a portion of the first line, a portion of the second line, or a portion of the inspection signal line.

Figure 11:
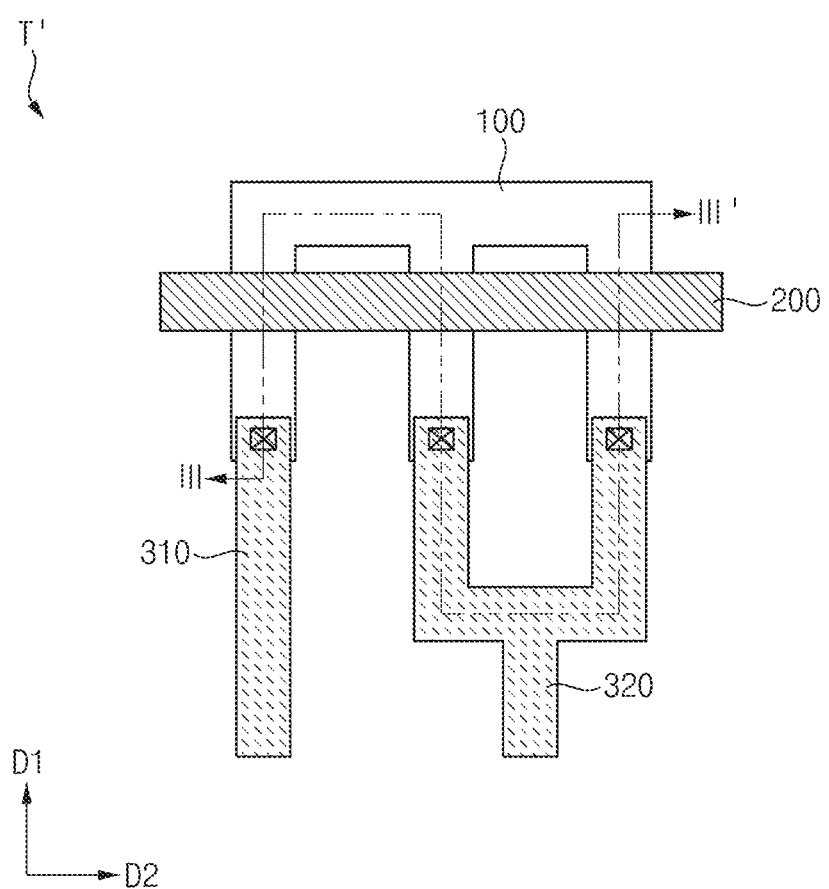
FIG. 11 is a plan view illustrating an embodiment of a transistor disposed in a peripheral area of a display device according to the disclosure.
Figure 12:
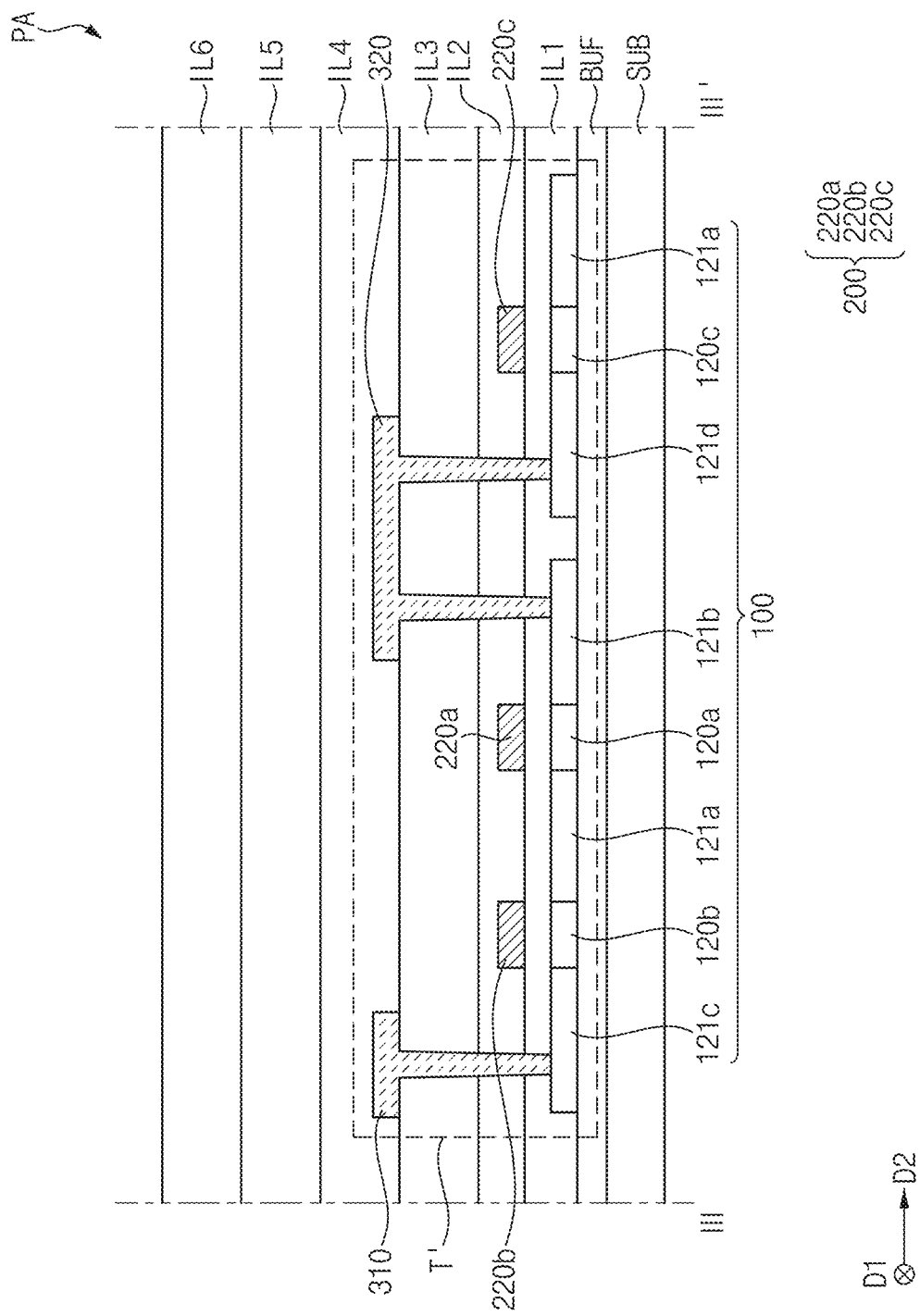
FIG. 12 is a cross-sectional view illustrating an embodiment of a cross section taken along line of III-III' FIG. 11.
Figure 13:
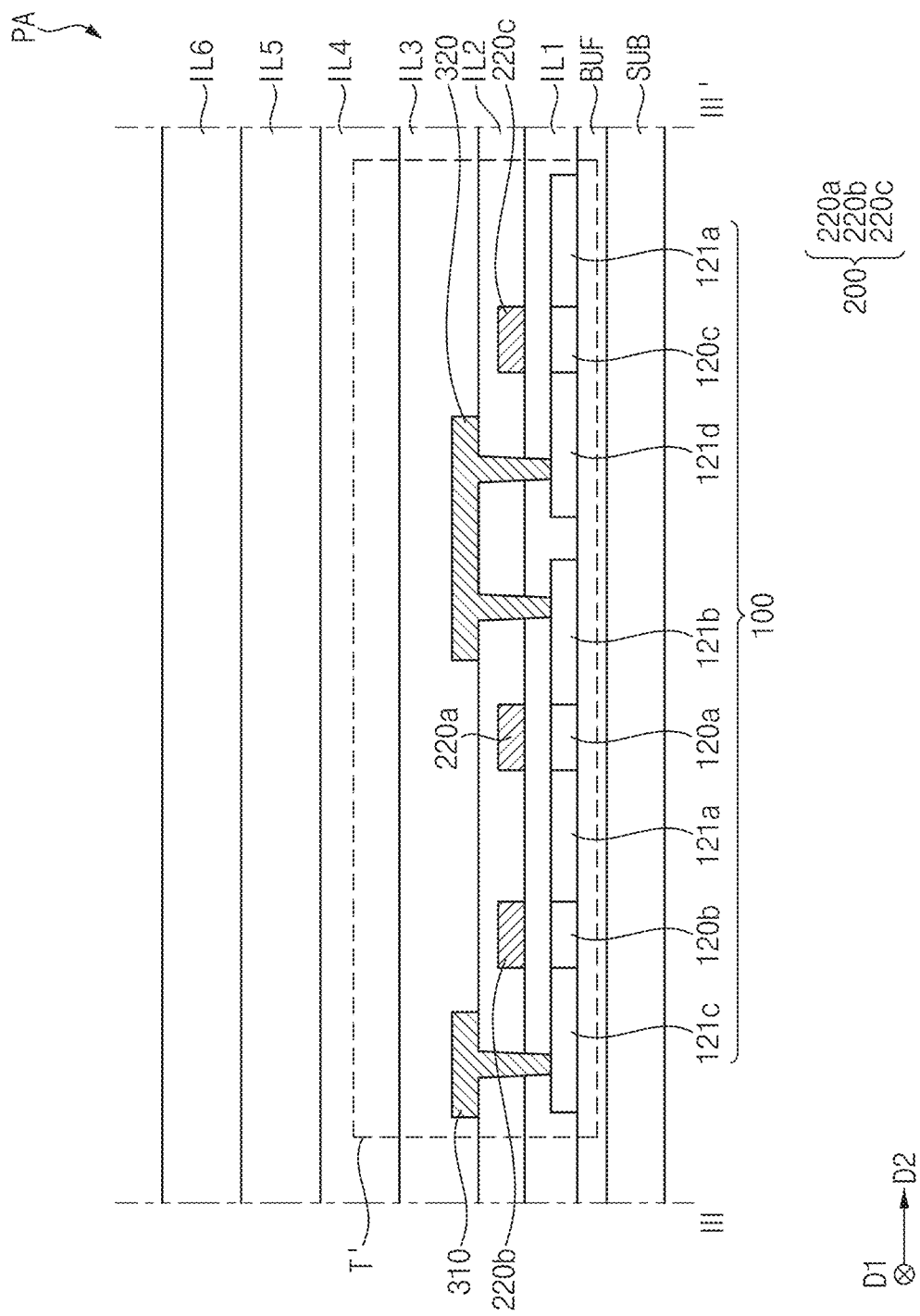
FIG. 13 is a cross-sectional view illustrating another embodiment of a cross section taken along line III-III' of FIG. 11.

FIG. 11 is a plan view illustrating an embodiment of a transistor disposed in a peripheral area of a display device according to the disclosure. FIG. 12 is a cross-sectional view illustrating an embodiment of a cross section taken along line of FIG. 11. FIG. 13 is a cross-sectional view illustrating another embodiment of a cross section taken along line of FIG. 11.

Referring to FIGS. 1, 11, 12, and 13, the display device DD in an embodiment may include a peripheral transistor T' disposed in the peripheral area PA on the substrate SUB. Hereinafter, descriptions overlapping those of the display device DD described with reference to FIGS. 8, 9, and 10 will be omitted or simplified.

In an embodiment, the peripheral transistor T' may have a triple transistor structure in which three transistors operated by the same control signal are connected in series with each other. In an embodiment, the peripheral transistor T' illustrated in FIGS. 11, 12, and 13 may correspond to at least one of the first scan driver transistor T1 illustrated in FIG. 3, the first emission driver transistor T1 illustrated in FIG. 5, and the lighting circuit portion transistors M1 and M2 illustrated in FIG. 6, for example. In another embodiment, the peripheral transistor T' illustrated in FIGS. 11, 12, and 13 may correspond to at least one of the second, third, fourth, fifth, sixth, seventh, and eighth scan driver transistors T2, T3, T4, T5, T6, T7, and T8 illustrated in FIG. 3 and the second, third, fourth, fifth, sixth, seventh, eighth, ninth, tenth, eleventh, and twelfth emission transistors T2, T3, T4, T5, T6, T7, T8, T9, T10, T11, and T12 illustrated in FIG. 5.

The peripheral transistor T' may include an active pattern 100, a gate line 200, a first electrode pattern 310, and a second electrode pattern 320.

The active pattern 100 may be disposed on the substrate SUB. In an embodiment, the active pattern 100 may include a metal oxide semiconductor, an inorganic semiconductor (e.g., amorphous silicon, poly silicon), or an organic semiconductor, for example. That is, the active pattern 100 may include the same material as that of the active layer ACT illustrated in FIG. 7.

The active pattern 100 may include a first region 121a, a second region 121b, a third region 121c, a fourth region 121d, a first channel region 120a, a second channel region 120b, and a third channel region 120c. The first channel region 120a may be disposed between the first region 121a and the second region 121b, and the second channel region 120b may be disposed between the first region 121a and the third region 121c. In addition, the third channel region 120c may be disposed between the first region 121a and the fourth region 121d. Impurities may be doped in the first, second, third, and fourth regions 121a, 121b, 121c, and 121d. In an embodiment, the third region 121c may be a source region, and the second region 121b and the fourth region 121d may be a drain region, for example. In an alternative embodiment, the third region 121c may be a drain region, and the second region 121b and the fourth region 121d may be a source region.

In an embodiment, the active pattern 100 may have an "E" shape in the plan view. However, the configuration of the disclosure is not limited thereto, and the active pattern 100 may have various planar shapes.

The gate line 200 may be disposed on the first insulating layer IL1. The gate line 200 may include the same material as that of the first gate electrode GE1 illustrated in FIG. 7 and may be disposed in the same layer as the first gate electrode GE1 illustrated in FIG. 7. In an embodiment, the gate line 200 may include a metal, an alloy, a metal nitride, a conductive metal oxide, a transparent conductive material, or the like, for example. These may be used alone or in any combinations with each other.

The gate line 200 may include a first gate pattern 220a, a second gate pattern 220b, and a third gate pattern 220c. The first gate pattern 220a may overlap the first channel region 120a of the active pattern 100 and the second gate pattern 220b may overlap the second channel region 120b of the active pattern 100. In addition, the third gate pattern 220c may overlap the third channel region 120c of the active pattern 100.

The first electrode pattern 310 and the second electrode pattern 320 may be disposed on the third insulating layer IL3. In the plan view, each of the first electrode pattern 310 and the second electrode pattern 320 may extend in a direction (e.g., the first direction D1) perpendicular to a direction (e.g., the second direction D2) in which the gate line 200 extends In an embodiment, the first electrode pattern 310 may extend in one direction (e.g., the first direction D1), and the second electrode pattern 320 may include a first portion and a second portion branched off from the first portion in the plan view and connected to the second region 121b and the fourth region 121d of the active pattern 100.

In an embodiment, as illustrated in FIG. 12, the first electrode pattern 310 may be connected to the third region 121c of the active pattern 100 through a contact hole penetrating a first portion of the first, second, and third insulating layers IL1, IL2, and IL3 and the second electrode pattern 320 may be connected to the second and fourth regions 121b and 121d of the active pattern 100 through a contact hole penetrating a second portion of the first, second, and third insulating layers IL1, IL2, and IL3. In this case, the first electrode pattern 310 and the second electrode pattern 320 may include the same material as that of the third gate electrode GE3 illustrated in FIG. 7 and may be disposed in the same layer as the third gate electrode GE3 illustrated in FIG. 7.

In another embodiment, as illustrated in FIG. 13, the first electrode pattern 310 may be connected to the third region 121c of the active pattern 100 through a contact hole penetrating a first portion of the first and second insulating layers IL1 and IL2 and the second electrode pattern 320 may be connected to the second and fourth regions 121b and 121d of the active pattern 100 through a contact hole penetrating a second portion of the first and second insulating layers IL1 and IL2. In this case, the first electrode pattern 310 and the second electrode pattern 320 may include the same material as that of the second gate electrode GE2 illustrated in FIG. 7 and may be disposed in the same layer as the second gate electrode GE2 illustrated in FIG. 7.

However, the configuration of the disclosure is not limited thereto, and the first electrode pattern 310 and the second electrode pattern 320 may be disposed in different layers. In an embodiment, the first electrode pattern 310 and the second electrode pattern 320 may include the same material as that of the source electrode SE and the drain electrode DE illustrated in FIG. 7 and may be disposed in the same layer as the source electrode SE and the drain electrode DE illustrated in FIG. 7, for example.

In an embodiment, the first electrode pattern 310 may be a source electrode, and the second electrode pattern 320 may be a drain electrode. In an embodiment, when the peripheral transistor T' corresponds to the first scan driver transistor T1 illustrated in FIG. 3, the first electrode pattern 310 may include a portion of a first line (e.g., the first line LN1 of FIGS. 1 and 2) that applies the scan start signal to a scan driver (e.g., the scan driver SDC of FIGS. 1 and 2), for example. That is, the peripheral transistor T' may be directly connected to the first line.

In an embodiment, when the peripheral transistor T' corresponds to the first emission driver transistor T1 illustrated in FIG. 5, the first electrode pattern 310 may include a portion of a second line (e.g., the second line LN2 of FIGS. 1 and 4) that applies the emission start signal to an emission driver (e.g., the emission driver EDV of FIGS. 1 and 2), for example. That is, the peripheral transistor T' may be directly connected to the second line.

In an embodiment, when the peripheral transistor T' corresponds to the lighting circuit portion transistors M1 and M2 illustrated in FIG. 6, the first electrode pattern 310 may include a portion of an inspection signal line (e.g., the inspection signal line LSL of FIGS. 1 and 6) that applies the lighting inspection signal to a lighting circuit portion (e.g., the lighting circuit portion of FIGS. 1 and 6), for example. That is, the peripheral transistor T' may be directly connected to the inspection signal line.

In another embodiment, the first electrode pattern 310 may be a drain electrode, and the second electrode pattern 320 may be a source electrode. In this case, as described in the case where the first electrode pattern 310 is the source electrode, the second electrode pattern 320 may include a portion of the first line, a portion of the second line, or a portion of the inspection signal line.

Figure 14:
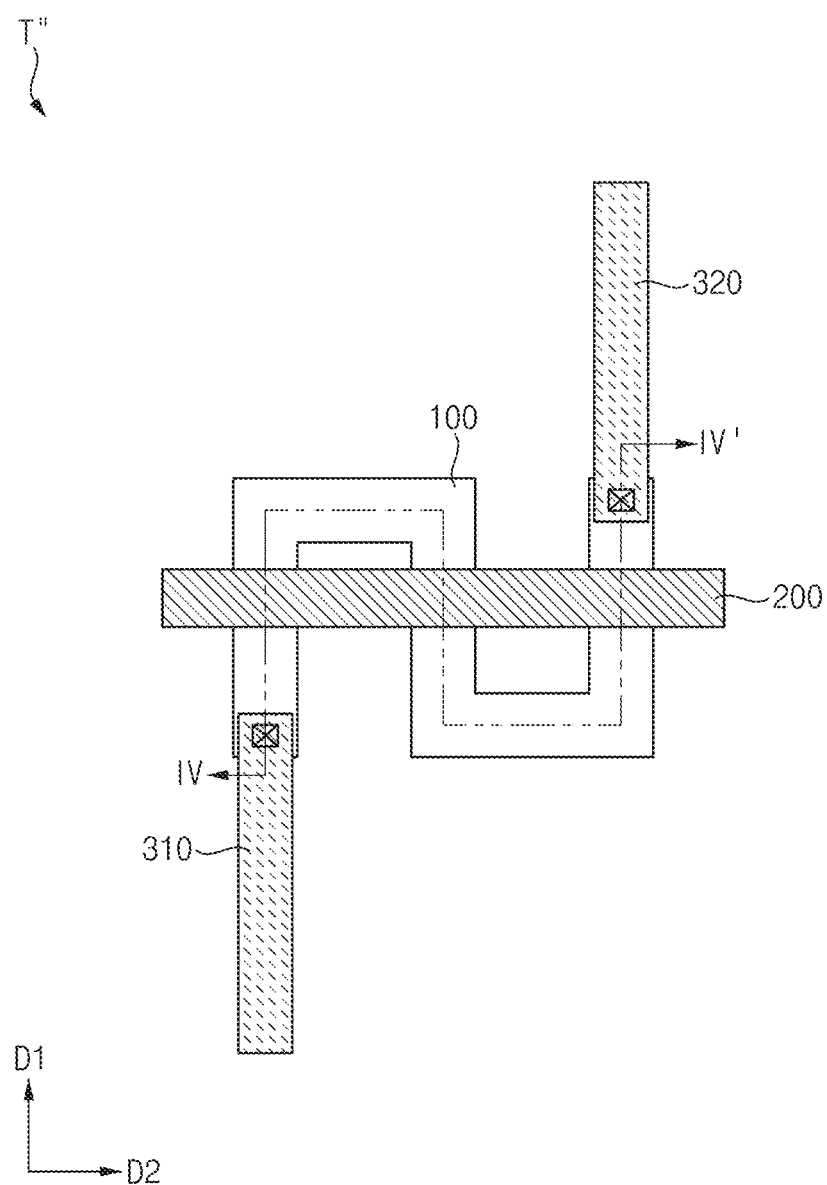
FIG. 14 is a plan view illustrating an embodiment of a transistor disposed in a peripheral area of a display device according to the disclosure.
Figure 15:
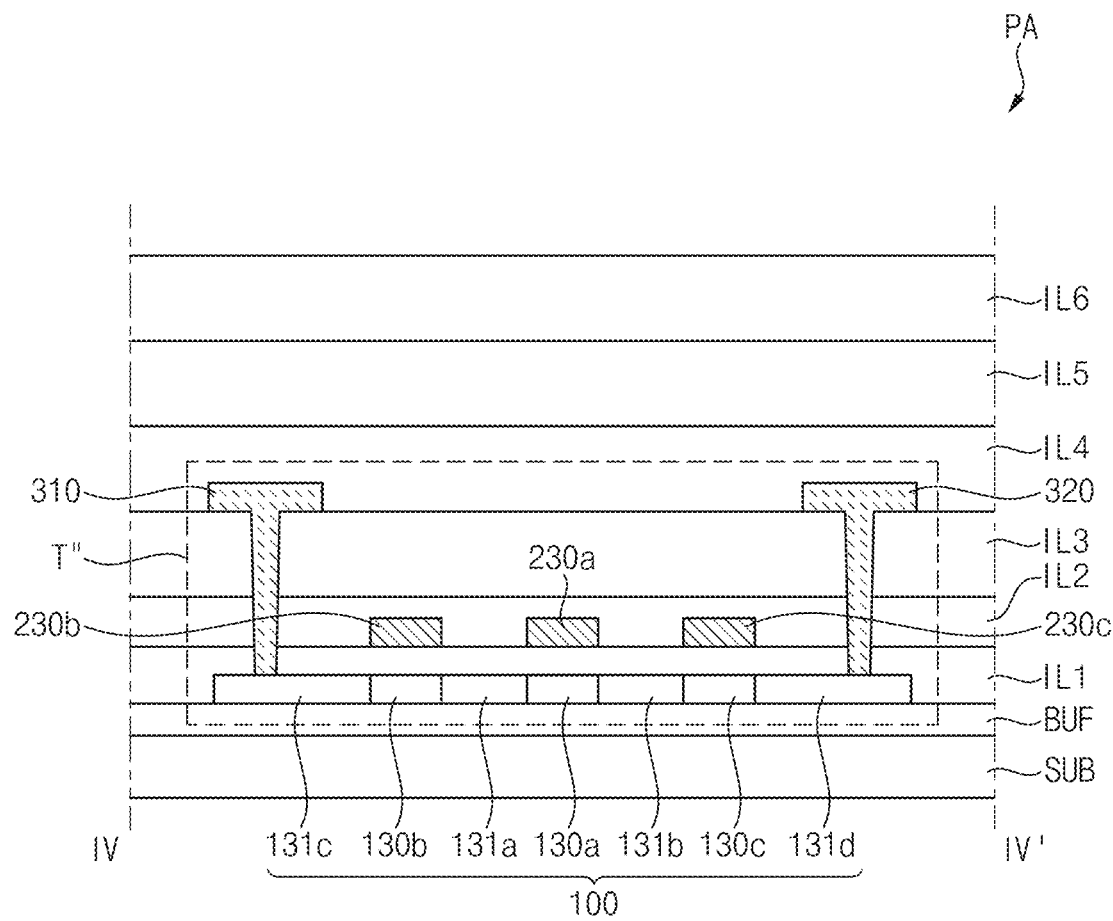
FIG. 15 is a cross-sectional view illustrating an embodiment of a cross section taken along line IV-IV' of FIG. 14.
Figure 16:
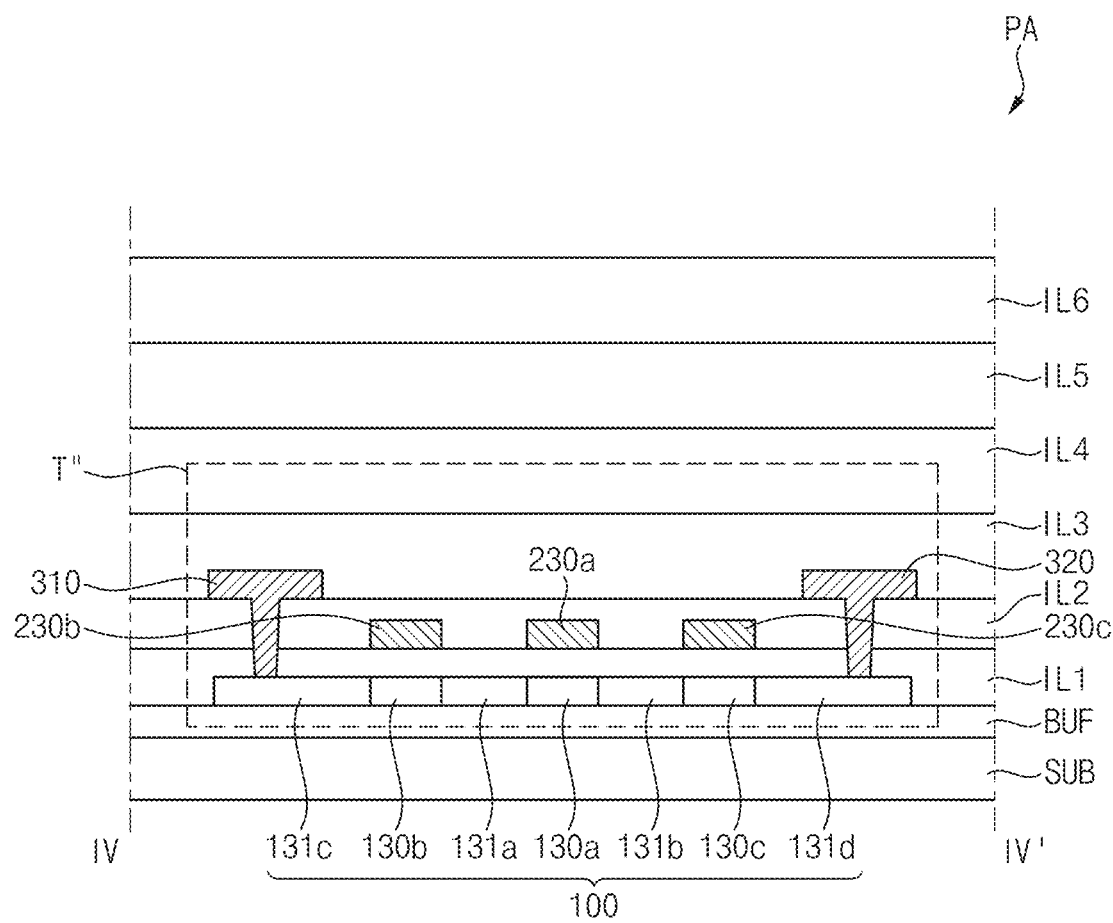
FIG. 16 is a cross-sectional view illustrating another embodiment of a cross section taken along line IV-IV' of FIG. 14.

FIG. 14 is a plan view illustrating an embodiment of a transistor disposed in a peripheral area of a display device according to the disclosure. FIG. 15 is a cross-sectional view illustrating an embodiment of a cross section taken along line IV-IV' of FIG. 14. FIG. 16 is a cross-sectional view illustrating another embodiment of a cross section taken along line IV-IV' of FIG. 14.

Referring to FIGS. 1, 14, 15, and 16, the display device DD in an embodiment may include a peripheral transistor T'' disposed in the peripheral area PA on the substrate SUB. Hereinafter, descriptions overlapping those of the display device DD described with reference to FIGS. 11, 12, and 13 will be omitted or simplified.

In an embodiment, the peripheral transistor T'' may have a triple transistor structure in which three transistors operated by the same control signal are connected in series with each other. In an embodiment, the peripheral transistor T'' illustrated in FIGS. 14, 15, and 16 may correspond to at least one of the first scan driver transistor T1 illustrated in FIG. 3, the first emission driver transistor T1 illustrated in FIG. 5, and the lighting circuit portion transistors M1 and M2 illustrated in FIG. 6, for example. In another embodiment, the peripheral transistor T'' illustrated in FIGS. 14, 15, and 16 may correspond to at least one of the second, third, fourth, fifth, sixth, seventh, and eighth scan driver transistors T2, T3, T4, T5, T6, T7, and T8 illustrated in FIG. 3 and the second, third, fourth, fifth, sixth, seventh, eighth, ninth, tenth, eleventh, and twelfth emission transistors T2, T3, T4, T5, T6, T7, T8, T9, T10, T11, and T12 illustrated in FIG. 5.

The peripheral transistor T'' may include an active pattern 100, a gate line 200, a first electrode pattern 310, and a second electrode pattern 320.

The active pattern 100 may be disposed on the substrate SUB. In an embodiment, the active pattern 100 may include a metal oxide semiconductor, an inorganic semiconductor (e.g., amorphous silicon, poly silicon), or an organic semiconductor, for example. That is, the active pattern 100 may include the same material as that of the active layer ACT illustrated in FIG. 7.

The active pattern 100 may include a first region 131a, a second region 131b, a third region 131c, a fourth region 131d, a first channel region 130a, a second channel region 130b, and a third channel region 130c. The first channel region 130a may be disposed between the first region 131a and the second region 131b, and the second channel region 130b may be disposed between the first region 131a and the third region 131c. In addition, the third channel region 130c may be disposed between the third region 131c and the fourth region 131d. Impurities may be doped in the first, second, third, and fourth regions 131a, 131b, 131c, and 131d. In an embodiment, the third region 131c may be a source region, and the fourth region 131d may be a drain region, for example. In an alternative embodiment, the third region 131c may be a drain region, and the fourth region 131d may be a source region.

In an embodiment, the active pattern 100 may have a "ㄹ" shape in the plan view. However, the configuration of the disclosure is not limited thereto, and the active pattern 100 may have various planar shapes.

The gate line 200 may be disposed on the first insulating layer IL1. The gate line 200 may include the same material as that of the first gate electrode GE1 illustrated in FIG. 7 and may be disposed in the same layer as the first gate electrode GE1 illustrated in FIG. 7. In an embodiment, the gate line 200 may include a metal, an alloy, a metal nitride, a conductive metal oxide, a transparent conductive material, or the like, for example. These may be used alone or in any combinations with each other.

The gate line 200 may include a first gate pattern 230a, a second gate pattern 230b, and a third gate pattern 230c. The first gate pattern 230a may overlap the first channel region 130a of the active pattern 100 and the second gate pattern 230b may overlap the second channel region 130b of the active pattern 100. In addition, the third gate pattern 230c may overlap the third channel region 130c of the active pattern 100.

The first electrode pattern 310 and the second electrode pattern 320 may be disposed on the third insulating layer IL3. In the plan view, each of the first electrode pattern 310 and the second electrode pattern 320 may extend in a direction (e.g., the first direction D1) perpendicular to a direction (e.g., the second direction D2) in which the gate line 200 extends.

In an embodiment, the first electrode pattern 310 may extend in one direction (e.g., the first direction D1), and the second electrode pattern 320 may include a first portion and a second portion branched off from the first portion in the plan view and connected to the second region 121b and the fourth region 121d of the active pattern 100.

In an embodiment, as illustrated in FIG. 15, the first electrode pattern 310 may be connected to the third region 131c of the active pattern 100 through a contact hole penetrating a first portion of the first, second, and third insulating layers IL1, IL2, and IL3 and the second electrode pattern 320 may be connected to the fourth region 131d of the active pattern 100 through a contact hole penetrating a second portion of the first, second, and third insulating layers IL1, IL2, and IL3. In this case, the first electrode pattern 310 and the second electrode pattern 320 may include the same material as that of the third gate electrode GE3 illustrated in FIG. 7 and may be disposed in the same layer as the third gate electrode GE3 illustrated in FIG. 7.

In another embodiment, as illustrated in FIG. 16, the first electrode pattern 310 may be connected to the third region 131c of the active pattern 100 through a contact hole penetrating a first portion of the first and second insulating layers IL1 and IL2 and the second electrode pattern 320 may be connected to the fourth region 131d of the active pattern 100 through a contact hole penetrating a second portion of the first and second insulating layers IL1 and IL2. In this case, the first electrode pattern 310 and the second electrode pattern 320 may include the same material as that of the second gate electrode GE2 illustrated in FIG. 7 and may be disposed in the same layer as the second gate electrode GE2 illustrated in FIG. 7.

However, the configuration of the disclosure is not limited thereto, and the first electrode pattern 310 and the second electrode pattern 320 may be disposed in different layers. In an embodiment, the first electrode pattern 310 and the second electrode pattern 320 may include the same material as that of the source electrode SE and the drain electrode DE illustrated in FIG. 7 and may be disposed in the same layer as the source electrode SE and the drain electrode DE illustrated in FIG. 7, for example.

In an embodiment, the first electrode pattern 310 may be a source electrode, and the second electrode pattern 320 may be a drain electrode. In an embodiment, when the peripheral transistor T''' corresponds to the first scan driver transistor T1 illustrated in FIG. 3, the first electrode pattern 310 may include a portion of a first line (e.g., the first line LN1 of FIGS. 1 and 2) that applies the scan start signal to a scan driver (e.g., the scan driver SDC of FIGS. 1 and 2), for example. That is, the peripheral transistor T''' may be directly connected to the first line.

In an embodiment, when the peripheral transistor T''' corresponds to the first emission driver transistor T1 illustrated in FIG. 5, the first electrode pattern 310 may include a portion of a second line (e.g., the second line LN2 of FIGS. 1 and 4) that applies the emission start signal to an emission driver (e.g., the emission driver EDV of FIGS. 1 and 2), for example. That is, the peripheral transistor T''' may be directly connected to the second line.

In an embodiment, when the peripheral transistor T''' corresponds to the lighting circuit portion transistors M1 and M2 illustrated in FIG. 6, the first electrode pattern 310 may include a portion of an inspection signal line (e.g., the inspection signal line LSL of FIGS. 1 and 6) that applies the lighting inspection signal to a lighting circuit portion (e.g., the lighting circuit portion of FIGS. 1 and 6), for example. That is, the peripheral transistor T''' may be directly connected to the inspection signal line.

In another embodiment, the first electrode pattern 310 may be a drain electrode, and the second electrode pattern 320 may be a source electrode. In this case, as described in the case where the first electrode pattern 310 is the source electrode, the second electrode pattern 320 may include a portion of the first line, a portion of the second line, or a portion of the inspection signal line.

According to the comparative example, not only the signal but also unintended electro-static discharge ("ESD") may flow into a signal line connected to a driver and transmitting a signal. When a transistor of the driver directly connected to the signal line has a single transistor structure, an excessive shift in a threshold voltage of the transistor may occur. Accordingly, defect in a display device may occur.

In the display device DD according to the disclosure, at least one of a driver transistor of a driver (e.g., the scan driver SDC or the emission driver EDV of FIG. 1) directly connected to a line that applies a start signal (e.g., the scan start signal or the emission start signal) and a lighting circuit portion transistor of a lighting circuit portion (e.g., the lighting circuit portion LC of FIG. 1) directly connected to a line that applies the lighting inspection signal may have a dual transistor structure in which two transistors are connected in series with each other, a triple transistor structure in which three transistors are connected in series with each other, or a multi-transistor structure in which four or more transistors are connected in series with each other. Accordingly, defect of the display device DD due to inflow of electro-static discharge may be improved.

Figure 17:
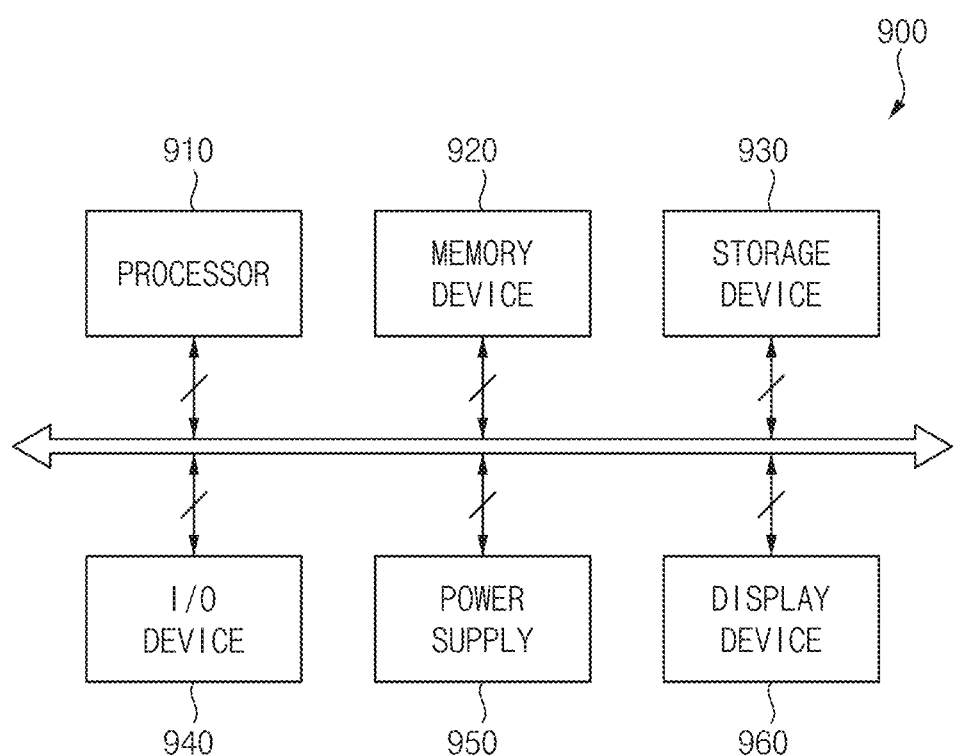
FIG. 17 is a block diagram illustrating an electronic device including the display device of FIG. 1.
Figure 18:
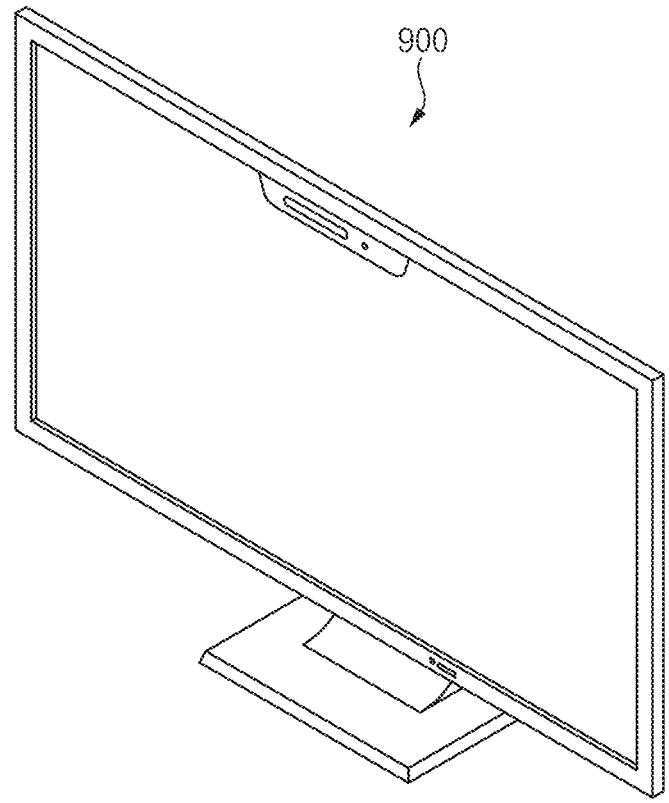
FIG. 18 is a diagram illustrating an embodiment in which the electronic device of FIG. 17 is implemented as a television.
Figure 19:
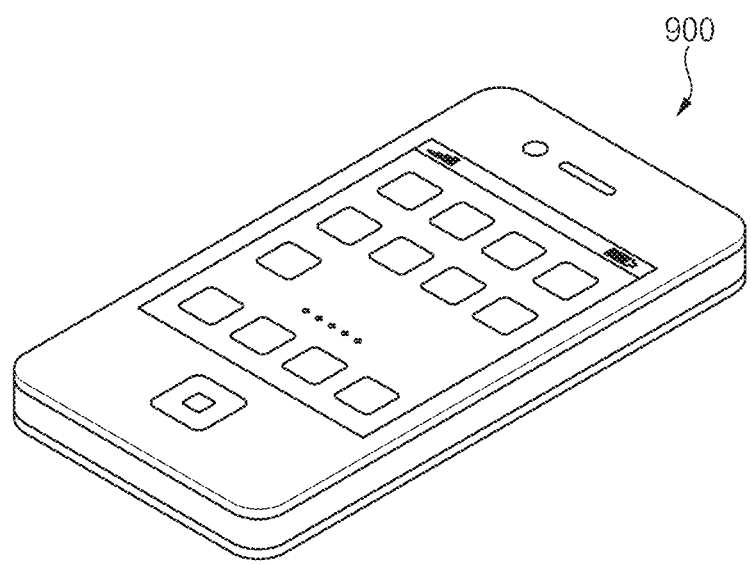
FIG. 19 is a diagram illustrating an embodiment in which the electronic device of FIG. 17 is implemented as a smartphone.

FIG. 17 is a block diagram illustrating an electronic device including the display device of FIG. 1. FIG. 18 is a diagram illustrating an embodiment in which the electronic device of FIG. 17 is implemented as a television. FIG. 19 is a diagram illustrating an embodiment in which the electronic device of FIG. 17 is implemented as a smartphone.

Referring to FIGS. 17, 18 and 19, in an embodiment, the electronic device 900 may include a processor 910, a memory device 920, a storage device 930, an input/output ("I/O") device 940, a power supply 950 and a display device 960. In this case, the display device 960 may correspond to the display device DD described with reference to FIGS. 1 to 16. The electronic device 900 may further include various ports capable of communicating with a video card, a sound card, a memory card, a universal serial bus ("USB") device, or the like.

In an embodiment, as illustrated in FIG. 18, the electronic device 900 may be implemented as a television. In another embodiment, as illustrated in FIG. 19, the electronic device 900 may be implemented as a smart phone. However, the disclosure is not limited thereto, in another embodiment, the electronic device 900 may be implemented as a cellular phone, a video phone, a smart pad, a smart watch, a tablet personal computer ("PC"), a car navigation system, a computer monitor, a laptop, a head mounted display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a compact disc read-only memory ("CD-ROM") device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The disclosure may be applied to various display devices. In an embodiment, the disclosure is applicable to various display devices such as display devices for vehicles, ships and aircraft, portable communication devices, display devices for exhibition or information transmission, medical display devices, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A display device comprising:
a substrate including a display area and a peripheral area adjacent to the display area;
a plurality of pixels disposed in the display area on the substrate, each of the plurality of pixels including a pixel transistor and an emission element connected to the pixel transistor; and
a driver disposed in the peripheral area on the substrate and including a driver transistor including:
an active pattern;
a first gate pattern disposed on the active pattern and overlapping a first channel region of the active pattern;
a second gate pattern disposed in a same layer as the first gate pattern and overlapping a second channel region of the active pattern;
a first electrode pattern disposed on the active pattern and connected to a source region of the active pattern; and
a second electrode pattern disposed on the active pattern and connected to a drain region of the active pattern,
wherein the driver includes a scan driver which applies a scan signal to the plurality of pixels, and the first electrode pattern includes a portion of a first line which applies a scan start signal to the scan driver, or
the driver includes an emission driver which applies an emission control signal to the plurality of pixels, and the first electrode pattern includes a portion of a second line which applies an emission start signal to the emission driver.

2. The display device of claim 1, wherein the driver includes the scan driver which applies the scan signal to the plurality of pixels.

3. The display device of claim 2, wherein the first electrode pattern includes the portion of a first line which applies the scan start signal to the scan driver.

4. The display device of claim 1, wherein the driver includes the emission driver which applies the emission control signal to the plurality of pixels.

5. The display device of claim 4, wherein the first electrode pattern includes the portion of the second line which applies an emission start signal to the emission driver.

6. The display device of claim 1, wherein the active pattern has a "ㄱ" shape in a plan view.

7. The display device of claim 1, further comprising:
a third gate electrode disposed in the display area on a second gate electrode,
wherein the pixel transistor includes:
an active layer;
a first gate electrode disposed on the active layer;
the second gate electrode disposed on the first gate electrode;
a source electrode connected to a source region of the active layer; and
a drain electrode in a same layer as the source electrode and connected to a drain region of the active layer.

8. The display device of claim 7, wherein the first electrode pattern and the second electrode pattern of the driver transistor are disposed in a same layer as the third gate electrode of the pixel transistor.

9. The display device of claim 7, wherein the first electrode pattern and the second electrode pattern of the driver transistor are disposed in a same layer as the second gate electrode of the pixel transistor.

10. The display device of claim 1, further comprising:
a lighting circuit portion disposed in the peripheral area on the substrate and including a lighting circuit portion transistor,
wherein the lighting circuit portion transistor has a same structure as the driver transistor.

11. The display device of claim 10, wherein a source electrode of the lighting circuit portion transistor includes a portion of an inspection signal line which applies a lighting inspection signal to the lighting circuit portion.

12. The display device of claim 1, wherein the active pattern includes a silicon semiconductor or a metal oxide semiconductor.

13. A display device comprising:
a substrate including a display area and a peripheral area adjacent to the display area;
a plurality of pixels disposed in the display area on the substrate, each of the plurality of pixels including a pixel transistor and an emission element connected to the pixel transistor; and
a driver disposed in the peripheral area on the substrate and including a driver transistor including:
an active pattern;
a first gate pattern disposed on the active pattern and overlapping a first channel region of the active pattern;
a second gate pattern disposed in a same layer as the first gate pattern and overlapping a second channel region of the active pattern;
a third gate pattern disposed in a same layer as the first gate pattern and overlapping a third channel region of the active pattern;
a first electrode pattern disposed on the active pattern and connected to a first region of the active pattern; and
a second electrode pattern disposed on the active pattern and connected to a second region of the active pattern.

14. The display device of claim 13, wherein the active pattern has an "E" shape in a plan view.

15. The display device of claim 13, wherein the first region is a source region, the second region is a drain region, and
the second electrode pattern includes a first portion and a second portion branched off from the first portion, the second portion connected to the second region in a plan view.

16. The display device of claim 13, wherein the first region is a drain region, the second region is a source region, and
the second electrode pattern includes a first portion and a second portion branched off from the first portion, the second portion connected to the second region in a plan view.

17. The display device of claim 13, wherein the active pattern has a "⊢" shape in a plan view.

18. The display device of claim 13, wherein the driver includes a scan driver which applies a scan signal to the plurality of pixels, and
the first electrode pattern includes a portion of a first line which applies a scan start signal to the scan driver.

19. The display device of claim 13, wherein the driver includes an emission driver which applies an emission control signal to the plurality of pixels, and
the first electrode pattern includes a portion of a second line which applies an emission start signal to the emission driver.

20. The display device of claim 13, further comprising:
a lighting circuit portion disposed in the peripheral area on the substrate and including a lighting circuit portion transistor,
wherein the lighting circuit portion transistor has a same structure as the driver transistor, and
a source electrode of the lighting circuit portion transistor includes a portion of an inspection signal line which applies a lighting inspection signal to the lighting circuit portion.

* * * * *